US007045955B2

(12) United States Patent
Seo et al.

(10) Patent No.: US 7,045,955 B2
(45) Date of Patent: May 16, 2006

(54) ELECTROLUMINESCENCE ELEMENT AND A LIGHT EMITTING DEVICE USING THE SAME

(75) Inventors: Satoshi Seo, Kanagawa (JP); Hiroko Yamazaki, Kanagawa (JP)

(73) Assignee: Semiconductor Energy Laboratory Co., Ltd., (JP)

( * ) Notice: Subject to any disclaimer, the term of this patent is extended or adjusted under 35 U.S.C. 154(b) by 216 days.

(21) Appl. No.: 10/635,959

(22) Filed: Aug. 7, 2003

(65) Prior Publication Data

US 2004/0027061 A1 Feb. 12, 2004

(30) Foreign Application Priority Data

Aug. 9, 2002 (JP) .............................. 2002-233758

(51) Int. Cl.
*H05B 33/00* (2006.01)
*H05B 33/14* (2006.01)

(52) U.S. Cl. ...................................... 313/506; 313/504
(58) Field of Classification Search ................ 313/504, 313/506, 509; 428/690, 917; 315/169.3
See application file for complete search history.

(56) References Cited

U.S. PATENT DOCUMENTS

| 4,871,236 A | 10/1989 | Gemma et al. ............. 350/355 |
| 4,971,919 A | 11/1990 | Yamazaki ....................... 437/2 |
| 5,478,777 A | 12/1995 | Yamazaki ................... 437/173 |
| 5,677,546 A | 10/1997 | Yu ................................ 257/40 |
| 5,682,043 A | 10/1997 | Pei et al. ...................... 257/40 |
| 5,970,318 A | 10/1999 | Choi et al. .................... 438/99 |
| 5,982,345 A | 11/1999 | Takayama et al. ........... 345/76 |
| 6,013,384 A | 1/2000 | Kido et al. ................. 428/690 |
| 6,107,734 A | 8/2000 | Tanaka et al. .............. 313/506 |
| 6,198,091 B1 | 3/2001 | Forrest et al. ........... 250/214.1 |
| 6,198,092 B1 | 3/2001 | Bulovic et al. .......... 250/214.1 |
| 6,278,055 B1 | 8/2001 | Forrest et al. .............. 136/263 |

(Continued)

FOREIGN PATENT DOCUMENTS

JP 2002-015873 1/2002

(Continued)

OTHER PUBLICATIONS

Shirakawa, H. et al, "Synthesis of Electrically Conducting Organic Polymers: Halogen Derivates of Polyacetylene, (CH)x," J.C.S. Chem. Comm., vol. 16, pp. 578-580 (1977), no month.

(Continued)

*Primary Examiner*—Karabi Guharay
(74) *Attorney, Agent, or Firm*—Cook, Alex, McFarron, Manzo, Cummings & Mehler, Ltd.

(57) ABSTRACT

An EL element which is thicker and lower-voltage drive without doping acceptor or donor than the conventional one. An EL element in which an electroluminescent film 103 containing an organic compound which can provide electroluminescent, a floating electrode 104, an electron transport supporting layer 105 and a cathode 102 are in order laminated on an anode 101. A film thickness of the electroluminescent film 103 is on the order of a conventional film thickness (on the order of approximately 100 nm), and the electron transport supporting layer 105 may also have a film thickness on the order of the electroluminescent film 103. The EL element can be driven at lower voltage than the conventional one by introducing a hole blocking material into an electron transport supporting layer.

60 Claims, 11 Drawing Sheets

U.S. PATENT DOCUMENTS

| | | | |
|---|---|---|---|
| 6,297,495 B1 | 10/2001 | Bulovic et al. | 250/214.1 |
| 6,300,612 B1 | 10/2001 | Yu | 250/208.1 |
| 6,352,777 B1 | 3/2002 | Bulovic et al. | 428/411.1 |
| 6,423,429 B1 | 7/2002 | Kido et al. | 428/690 |
| 6,451,415 B1 | 9/2002 | Forrest et al. | 428/212 |
| 6,452,092 B1 | 9/2002 | Han et al. | 136/263 |
| 6,483,236 B1 | 11/2002 | Hung | 313/506 |
| 6,524,884 B1 | 2/2003 | Kim et al. | 438/99 |
| 6,573,651 B1* | 6/2003 | Adachi et al. | 313/504 |
| 6,580,213 B1 | 6/2003 | Yamazaki | 313/506 |
| 6,660,411 B1* | 12/2003 | Sato et al. | 428/690 |
| 6,692,820 B1 | 2/2004 | Forrest et al. | 428/212 |
| 6,844,025 B1 | 1/2005 | Forrest et al. | 427/74 |
| 6,885,149 B1* | 4/2005 | Parthasarathy et al. | 313/504 |
| 2001/0031509 A1 | 10/2001 | Yamazaki | 438/48 |
| 2001/0046611 A1 | 11/2001 | Kido et al. | 428/690 |
| 2002/0028347 A1 | 3/2002 | Marrocco, III et al. | 428/690 |
| 2002/0119297 A1 | 8/2002 | Forrest et al. | 428/199 |
| 2002/0189666 A1 | 12/2002 | Forrest et al. | 136/263 |
| 2002/0197462 A1 | 12/2002 | Forrest et al. | 428/212 |
| 2003/0042846 A1 | 3/2003 | Forrest et al. | 313/503 |
| 2003/0127967 A1 | 7/2003 | Tsutsui et al. | 313/498 |
| 2003/0189401 A1 | 10/2003 | Kido et al. | 313/504 |
| 2003/0209974 A1 | 11/2003 | Yamazaki | 313/504 |
| 2003/0218166 A1 | 11/2003 | Tsutsui | 257/40 |
| 2004/0027059 A1 | 2/2004 | Tsutsui | 313/504 |
| 2004/0113546 A1 | 6/2004 | Forrest et al. | 313/504 |
| 2004/0150333 A1 | 8/2004 | Tsutsui | 313/512 |
| 2004/0151887 A1 | 8/2004 | Forrest et al. | 428/212 |
| 2005/0023522 A1 | 2/2005 | Frey et al. | 257/40 |

FOREIGN PATENT DOCUMENTS

| | | |
|---|---|---|
| JP | 2003-045676 | 2/2003 |

OTHER PUBLICATIONS

Tang, C.W. et al, "Organic Electroluminescent Diodes," *Appl. Phys. Lett.*, vol. 51, No. 12, pp. 913-915, Sep. 21, (1987).

Adachi, C. et al, Electroluminescence in Organic Films with Three-Layer Structure, *Japanese Journal of Applied Physics*, vol. 2, No. 2, pp. L269-L271, Feb., (1988).

Tsutsui, T., "Textbook of the 3$^{rd}$ Seminar at Division of Organic Molecular Electronics and Bioelectronics," The Japan Society of Applied Physics, pp. 31-37, (1993), with English translation pp. 1-11, no month.

Wakimoto, T. et al, "Organic EL Cells Using Alkaline Metal Compounds as Electron Injection Materials," *IEEE Transactions on Electron Devices*, vol. 44, No. 8, pp. 1245-1248, Aug., (1997).

Blochwitz, J. et al, "Low Voltage Organic Light Emitting Diodes Featuring Doped Phthalocyanine as Hole Transport Material," Applied Physics Letters, vol. 73, No. 6, pp. 729-731, Aug. 10, (1998).

Sato, Y., "Problem for Implementation in View of Materials Development," The Japan Society of Applied Physics/ Organic Molecular Electronics and Bioelectronics, vol. 11, No. 1, pp. 86-99 (2000), no month.

Elschner, A. et al, 'High-Resistivity PEDT/PSS for Reduced Crosstalk in Passive Matrix OELs,' *Asia Display/IDW '01*, pp. 1427-1430 (2001), no month.

Kido, J. et al, "Extended Abstracts—The 49$^{th}$ Spring Meeting 2003 of the Japan Society of Applied Physics and Related Societies," No. 3, abstract No. 27p-YL-3, p. 1308, (2002), no month.

* cited by examiner

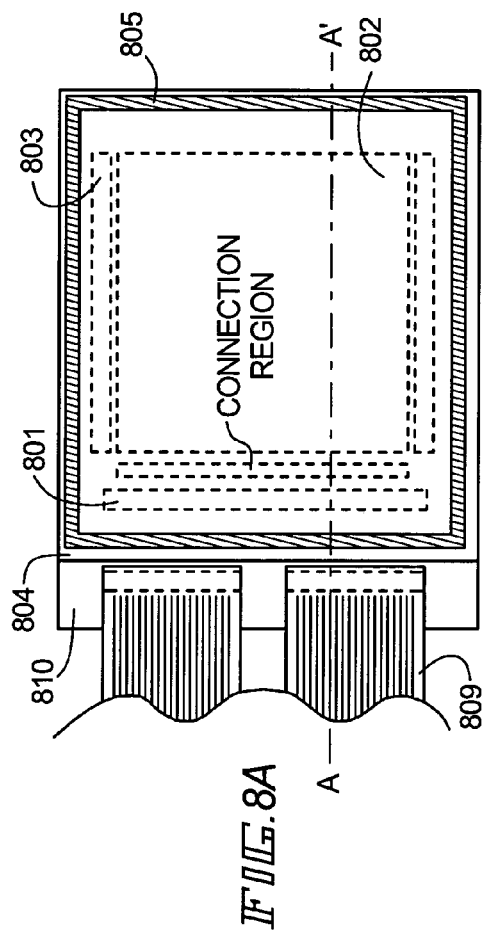
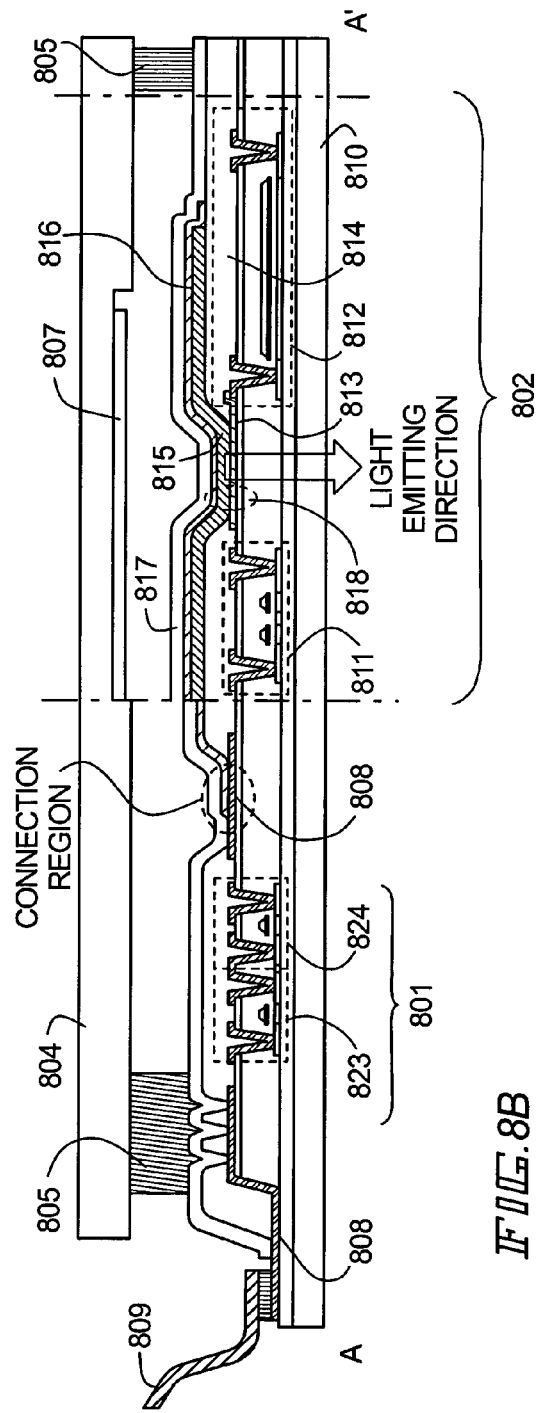
FIG. 8A
FIG. 8B

ELECTROLUMINESCENCE ELEMENT AND A LIGHT EMITTING DEVICE USING THE SAME

BACKGROUND OF THE INVENTION

1. Field of the Invention

The present invention relates to an electroluminescent device (hereinafter, an EL element) having a film comprising an organic compound (hereinafter, an electroluminescent film) that emits light by applying an electronic field, an anode, and a cathode. More particularly, the present invention relates to an EL element that has good yields, high reliability, and low-voltage drive; and a light emitting device that includes the EL element. A light emitting device in this specification includes an image display device including an EL element, and also module in which a connector, a flexible printed circuit board (FPC), TAB (tape automated bonding), or TAB (tape carrier package) are attached to an EL element, or module in which a print circuit plate is attached to a tip of the TAB or TCP, or module in which IC (integrated circuit) is mounted directly on an EL element by COG (Chip On Glass).

2. Description of the Related Art

The EL element includes an organic compound as a ruminant object emits light by being applied electric field and current. The luminescence mechanism is described as flowing: by applying a voltage to an electroluminescent film sandwiched between electrodes, electrons injected from the cathode and holes injected from the anode are recombined in the electroluminescent film to form molecules in an exciting state (hereinafter referred to as "molecular exciton"); and energy is radiated when the molecular exciton moves back toward the ground state thereof.

The kind of the molecular exciton which is made from the organic compound may be a singlet exciton state or a triplet exciton state. In the present specification, luminescence may be based on any one of the two.

In such an EL element, an electroluminescent film is generally formed into a thin film to have a thickness of approximately 100 nm. In the EL element, the electroluminescent film emits light spontaneously, therefore, backlight used in the conventional liquid crystal displays is unnecessary. As a result, the EL element has a great advantage of being fabricated thinly and lightly.

Also, for example, a period from the injection of a carrier to the recombination of an electroluminescent film having a thickness of approximately 100 nm is about several ten nanoseconds considering the carrier mobility. Even when a process from the recombination of a carrier to light emission is included in the period, light is emitted within the order of microsecond. Thus, an extremely high response speed is one of characteristics thereof.

Further, since the EL element includes an organic compound as a ruminant object is a carrier injection type device, it can be driven by a direct current voltage, thereby noise is hard to generate. With respect to a drive voltage, an electroluminescent film is fabricated into a uniform ultra thin film having a thickness of approximately 100 nm, an electrode material such that a carrier injection barrier to the electroluminescent film is decreased is selected, and a hetero structure (two-layers structure) is introduced. Thus, a sufficient luminance of 100 cd/m$^2$ at 5.5V has been achieved (Reference 1: C. W. Tang and S. A. VanSlyke, Applied Physics Letters, vol. 51, No. 12, pp. 913–915 (1987)).

The EL element includes an organic compound as a luminant object has characteristics such as a thin type, lightweight, high speed responsibility, and direct-current low-voltage drive. Owing to this, the EL element is noted as a light emitting device for a next generation flat panel display. In addition, since the EL element is a self-luminous type and has a wide viewing angle, the visibility is relatively good. Thus, it is considered that the EL element is preferable for a display screen of a car mounted electronic appliance or mobile appliance. In fact, the EL element is used for area color of display screen of mounted type car audio.

The EL element disclosed in Reference 1 is adapted so-called "division of function" wherein a hole transporting layer transports a hole and an electron transporting light emitting layer transports of an electron and emits light. The conception of the division of function is developed to a conception of a double hetero structure (three-layer structure) wherein a light emitting layer is sandwiched between a hole transporting layer and an electron transporting layer (Reference 2: C. Adachi, S. Tokito, T. Tsuitsui and S. Saito, Japanese Journal of Applied Physics, vol. 27, No. 2, L. 269–271 (1988)).

One of advantages of the division of function is that there is no need for giving various functions (light emission, carrier transportation, carrier injection from an electrode, or the like) to one kind of organic material, in consequence, molecular design freedom etc. can be expanded widely (for example, it is not necessary to find bipolar materials). By combining a material having good light emitting characteristics, high transportability, or the like, high luminous efficiency can easily achieved.

With respect to division of function, a conception of an anode buffer layer or a cathode buffer layer is suggested for injecting carriers to reduce drive voltage. For example, there is a report that the drive voltage can be reduced by enhancing injection of carrier by means of inserting materials that ease energy barrier into an interface between cathode and the electroluminescent film (Reference 3: Takeo Wakimoto, Yoshinori Fukuda, Kenichi Nagayama, Akira Yokoi, Hitoshi Nakada, and Masami Tsuchida, IEEE TRANSACTIONS ON ELECTRON DEVICES, Vol. 44, No. 8, 1245–1248 (1997)). In Reference 3, it is disclosed that Wakimoto et al. succeeded to reduce drive voltage by using $Li_2O$ as a cathode buffer layer.

With respect to a buffer layer, a buffer layer comprising polymer (hereinafter, a polymer buffer layer) attracts especially attention in recent years (Reference 4: Yoshiharu Sato, Molecular Electronics and Bioelectronics (The Japan Society of Applied Physics), vol. 11, No. 1, 86–99 (2000)). In Reference 4, it is disclosed that using a polymer anode buffer layer promotes the lower voltages, longer lifetime, and higher heat resistance. It can be said that it has an effect on preventing short-circuiting.

Since the conductivity of a polymer buffer layer is improved by introducing appropriate acceptor or donor thereinto, the EL element including the polymer buffer layer can be formed into thick that could not emit light unless it has a thickness of approximately 100 nm, normally. Consequently, it is disclosed that the electroluminescent film can be flattened releasing adverse effects of contaminants or projections on an electrode in Reference 4. Thus, there is a risk for short-circuiting due to contaminants or projections on an electrode conventionally, however, the polymer buffer layer is effective in reducing the risk. According to this, there is also advantage that the improvement in yields can be expected.

Therefore, above-mentioned polymer buffer layer can solve simultaneously the conflictive two objects of thickening the film and reducing the drive voltage that has been a serious dilemma for an EL element.

In order to use a polymer buffer layer for thickening the film, water is often used for solvent. However, water solvent is not preferable for EL element having an organic compound because the organic compound is easily damaged by moisture. According to Reference 4, some organic solvent can be used, however, generation of impurities cannot inevitable as far as wet process is used. It may cause the deterioration of the EL element.

When the EL element including the buffer layer made from these materials is used for respective pixels in matrix of display device, a problem of crosstalk is arisen. In more detail, leakage current is caused in places between the polymer buffer layer and wirings (or between pixels) because almost polymer buffer layer is gave conductivity and is generally spin coated on whole surface.

For example, it is reported that crosstalk is caused by fabricating a passive matrix display device that has an anode buffer layer made from polyethylene dioxythiophene/polystyrene sulfonate (hereinafter referred to as "PEDOT/PSS") that is conductive polymer added with acceptor (Reference 5: A. Elschner, F. Jonas, S. Kirchmeyer, K. Wussow, Asia Display/IDW '01, 1427–1430 (2001)). In Reference 5, it is reported that crosstalk is prevented by increasing the resistivity of PEDOT/PSS on purpose. However, if the resistivity is increased, the polymer buffer layer cannot formed to be thick (that is, current become difficult to be applied to the EL element). Therefore, an advantage of preventing short-circuiting by flattening an electrode surface as a result of thickening of the electroluminescent film will be lost. In addition, an advantage of low drive voltage will also lost because increasing the resistivity causes high drive voltage.

On the other hand, means for fabricating a thick EL element from an organic compound and acceptor (or donor) by co-evaporation in vacuo consistently (Reference 6: J. Blochwitz, M. Pfeiffer, T. Fritz, and K. Leo, Applied Physics Letters, vol. 73, No. 6, pp. 729–731 (1998)). In Reference 6, it is disclosed that a thick EL element that is driven at low drive voltage can be fabricated from VoPc as a hole transporting material and F4-TCNQ as an acceptor by co-evaporation.

By this method, generation of impurities can be reduced, moreover, a problem of crosstalk can be prevented because patterning can be conducted using shadow masks. However, there is a problem, which will influence lifetime of the EL element, of chemical stability of acceptor or donor that will be doped. The problem of chemical stability of acceptor or donor will be arisen in the case of using a polymer buffer layer. A conception that is differ substantially from above is reported that a novel EL element structure wherein thickening the film causes increasing current efficiency (Reference 7: J. Kido, J. Endo, T. Nakada, K. Mori, A. Yokoi, T. Matsumoto, 49th Japan Society of Applied Physics and Related Societies, p. 1308, 27p-YL-3, (March 2002)). Conducting means disclosed in Reference 7 brings an advantage that the current efficiency can be improved, however, more deal of voltage is needed to apply compared to the conventional EL element.

SUMMARY OF THE INVENTION

If the device structure disclosed in Reference 7 is used, improving indefinitely the current efficiency is theoretically possible. However, if the current efficiency is improved two times, three times, or more, the drive voltage is also increased two times, three times, or more. Thus, the device structure disclosed in Reference 7 is preferable to use for lighting, but not preferable to use for a portable appliance that needs to be driven at low voltage.

Therefore, the EL element that has good yields, high reliability, and is driven at low voltage by means of thickening is desired to be fabricated.

In view of the foregoing, it is an object of the present invention to provide an EL element which is thicker and lower-voltage drive without doping acceptor or donor than the conventional one. In particular, it is an object of the present invention to provide an EL element which has good yields, long lifetime, and low-voltage drive. It is another object of the present invention to provide a light emitting device that is durable and has good yields by using the EL element.

The present inventors have suggested a solution to the above object that a novel device structure is formed as the result of enthusiastic investigations. In FIGS. 1, 2, and 12, fundamental structures of the novel device structure are shown.

FIG. 1 shows an EL element in which an electroluminescent film 103 including an organic compound capable of generating electroluminescent, a floating electrode 104, an electron transport supporting layer 105 and a cathode 102 are in order laminated on an anode 101. A film thickness of the electroluminescent film 103 is on the order of a conventional film thickness (on the order of approximately 100 nm), and the electron transport supporting layer 105 may also have a film thickness on the order of the electroluminescent film 103.

With such device structure, it is found out by the present inventors that it is possible to operate with the almost same drive voltage as that of a conventional EL element (that is, a structure in which only the electroluminescent film 103 is sandwiched between the anode and the cathode) or the drive voltage can be further lowered. This means that an EL element that has a thick film thickness operates with a low voltage even if the EL element is fabricated without adding an accepter or a donor, and namely, leads to an excellent EL element with respect to device lifetime and a drive voltage in addition to a good yield.

Accordingly, the EL element according to the present invention is characterized in that an anode, an electroluminescent film including an organic compound capable of generating electroluminescence, a floating electrode, an electron transport supporting layer and a cathode are laminate in order.

In resent years, a method of forming a film of a cathode by sputtering has been investigated. However, damage to an organic compound at sputtering, specifically to a light-emitting region, is concerned (In order to prevent the damage, sputtering is performed mainly after a film of CuPc is formed). In the present invention of FIG. 1, there is almost no damage to the electroluminescent film 103 since the film thickness of the electron transport supporting layer 105 can be made relatively thick. Therefore, the present invention is much effective in the case of forming the cathode 102 by sputtering.

Accordingly, the present invention is characterized in that the cathode includes a conductive film formed with sputtering in the structure of FIG. 1. Further, it is the present invention that is suitable also in the case of forming a transparent electrode as the cathode with sputtering and taking light out from the side of the cathode. Therefore, the present invention is characterized in that the cathode has a transparency includes a conductive film formed with sputtering in the structure of FIG. 1.

Furthermore, the effect of the present invention can be obtained also in a structure (FIG. 2) in which the structure of FIG. 1 is laminated in the reverse direction to be turned upside down, that is, an EL element in which an electron transport supporting layer 205, a floating electrode 204, an electroluminescent film 203, and an anode 201 are in order laminated on a cathode 202. In this case also, a film thickness of the electroluminescent film 203 is on the order of a conventional film thickness (on the order of 100 nm), and the electron transport supporting layer 205 may also have a film thickness on the order of the electroluminescent film 203.

Accordingly, the EL element according to the present invention is characterized in that a cathode, an electron transport supporting layer, a floating electrode, an electroluminescent film including an organic compound capable of generating electroluminescence, and an anode are laminate in order.

In addition, FIG. 12 shows an EL element in which an electroluminescent film 603 including an organic compound capable of generating electroluminescence, an electron transporting layer 606, a floating electrode 604, an electron transport supporting layer 605 and a cathode 602 are in order laminated on an anode 601. Such structure that the floating electrode 604 is sandwiched between the electron transporting layer and the electron transport supporting layer 605 may be employed. When the floating electrode 604 and the electroluminescent film 603 are separated from each other by the electron transporting layer 606, quenching due to the floating electrode 604 is effectively prevented. The effect of the present invention, of course, can be obtained also in a structure in which the structure of FIG. 12 is laminated in the reverse direction to be turned upside down.

There are various variations on the structure of the electroluminescent film, such as a laminate structure of a hole transporting layer and an electron transporting layer, a single-layered structure of a polymer compound, a high efficiency device which utilizes emission form a triplet excitation state. Further, each of the electron transporting layer and the electron transport supporting layer may have any structure of a single-layered structure and a laminate structure.

It is noted that a singlet excitation and a triplet excitation state are considered as molecular excitons formed in an organic compound and the present specification includes any contribution of the excitation states to emission of light.

With respect to the above electron transport supporting layer, it is preferable to have an electron transporting material that has larger electron mobility rather than hole mobility since the electron transport supporting layer is a layer for conceptually making only electrons pass.

In addition, a more preferable structure according to the present invention has a hole blocking material contained in at least one of the electroluminescent film and the electron transport supporting layer. With such structure, it is possible to attempt driving with the almost same drive voltage as that of a conventional EL element (that is, a structure in which only the electroluminescent film 103 is sandwiched between the anode and the cathode) or the further lowered drive voltage. In this case, it is further preferable that the hole blocking material is contained in the electron transport supporting layer.

It is noted that it is preferable that the hole blocking material has an ionization potential more than 5.8 eV. As preferable materials, there given an organic compound including a phenanthroline skeleton and a 5-coordinate metal complex that has as a central metal an element belonging to group 13 of the periodic table.

Now, it is usually necessary, as a cathode, to use a material that has a small work function, that is, an unstable material that is subject to oxidation. In the case of laminating in order from an anode to a cathode, the unstable cathode is exposed at the most surface (FIG. 1, for example). However, there is an advantage that an EL element according to the present invention sufficiently functions even if a cathode is formed of a conductor that has a work function more than 3.5 eV in the case of applying a hole blocking material to an electron transport supporting layer. Accordingly, the present invention is characterized in that a cathode is composed of a conductor that has a work function more than 3.5 eV in the case of applying a hole blocking material to an electron transport supporting layer.

Further, it is preferable that the floating electrode is composed of a conductor that has a work function less than 3.5 eV since it is necessary to inject an electron to an electroluminescent film. Although the conductor that has a work function less than 3.5 eV is subject to oxidation and unstable, it is possible in the present invention to suppress degradation since the floating electrode is floating, that is, a periphery thereof is covered with other materials.

Furthermore, as another structure of the floating electrode, there may be a structure formed of an insulating film provided at the side in contact with the electroluminescent film and a conductive film provided at the side in contact with the electron transport supporting film. In this case, lithium fluoride and calcium fluoride are effective as the insulating film.

In the above-mentioned EL element according to the present invention, it is possible to fabricate the electron transport supporting layer to have a film thickness more than 10 nm and less than 1 μm. Therefore, it is possible to make efficiently a film thickness of the EL element itself thick.

The above-mentioned EL element according to the present invention operates with a low voltage in spite of manufacturing to have a thick film thickness without adding an accepter or a donor, and is excellent with respect to a device lifetime and a drive voltage in addition to a good yield. Accordingly, a light emitting device using an EL element according to the present invention and an electric appliance using the light emitting device have a good yield and an advantage of lasting long.

It is noted that the present invention includes the light emitting device using the EL element according to the present invention and the electric appliance using the light emitting device.

It is also noted that a light emitting device in this specification includes an image display device including an EL element, and also module in which a connector, a flexible printed circuit board (FPC), TAB (tape automated bonding), or TAB (tape carrier package) are attached to an EL element, or module in which a print circuit plate is attached to a tip of the TAB or TCP, or module in which IC (integrated circuit) is mounted directly on an EL element by COG (Chip On Glass).

BRIEF DESCRIPTION OF THE DRAWINGS

FIGS. 8A and 8B are views showing a top surface view and a cross sectional view of a light emitting device;

DESCRIPTION OF THE PREFERRED EMBODIMENTS

Hereinafter, an embodiment mode of the present invention will be described in detail, giving a working mechanism and a specific example of a structure. It may be enough that an EL element has one transparent electrode to take emitted light out. Therefore, it is possible to apply not only a conventional device structure which has a transparent electrode formed on a substrate for taking light out from a substrate side, but also a structure for taking light out from the opposite side to the substrate side and a structure for taking light out form the both side of the electrode.

Figure 3A:
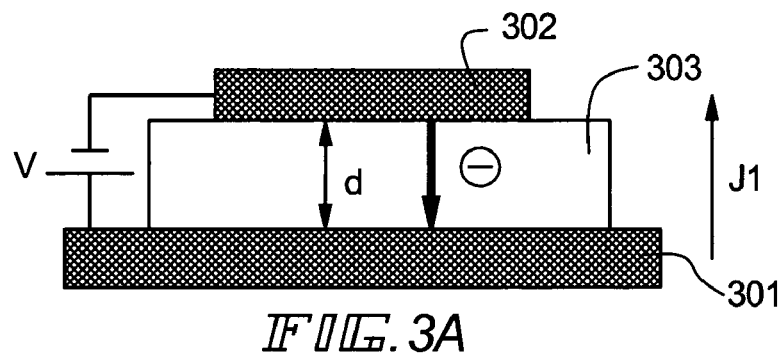
FIGS. 3A–3C are views showing a working mechanism of the present invention.

First, a working mechanism an EL element according to the present invention will be described with FIGS. 3A to 4C. In FIG. 3A, an organic compound layer 303 is sandwiched between electrodes 301 and 302, and composed of an electron transporting material here. Further, it is assumed that the electrodes 301 and 302 are designed in order to make only electron current flow, and electric current with electric current density J1 flows when voltage V is applied with film thickness d of the organic compound layer 303.

The electric current density J1 is electric current called Space Charge Limited Current (SCLC). The SCLC is electric current that flows when a space charge is injected from the outside and moved. The electric current density of the SCLC is expressed by Child's Law, i.e., the following Formula 1. In Formula 1, $\in$ denotes relative dielectric constant, $\in_0$ denotes dielectric constant in vacuo, and $\mu$ denotes carrier mobility:

$$J1 = 9/8 \cdot \in \in_0 \mu \cdot V^2/d^3 \quad \text{[Formula 1]}$$

When Formula 1 is generalized, the following Formula 2 is obtained. In Formula 2, $\alpha$ denotes a constant that is specific to a material:

$$J1 = \alpha \cdot V^2/d^3 \quad \text{[Formula 2]}$$

Figure 3B:
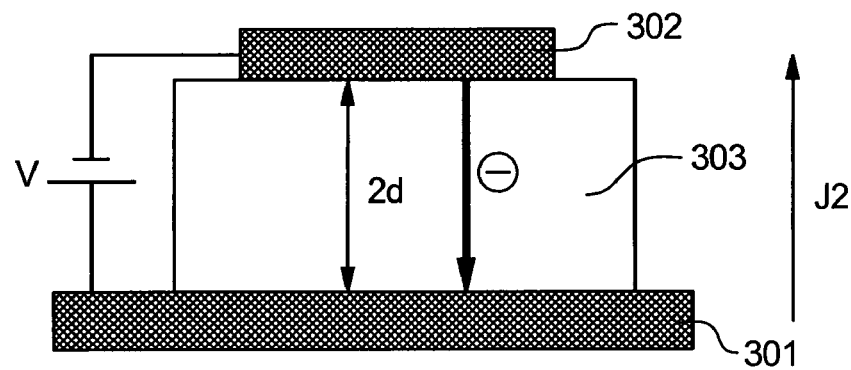

Here, it is assumed that a film of quite the same material is formed to have a twice thickness, that is, 2d, and the voltage V is applied (FIG. 3B). At this time, electric current density J2 is expressed by the following Formula 3:

$$J2 = \alpha \cdot V^2/(2d)^3 = \alpha/8 \cdot V^2/d^3 \quad \text{[Formula 3]}$$

It is understood that J1=8·J2 from Formula 1 and 2. Namely, with a simple application to the formula of SCLC, it is understood that an amount of flowing electric current is suddenly decreased when a film thickness is increased.

Figure 3C:
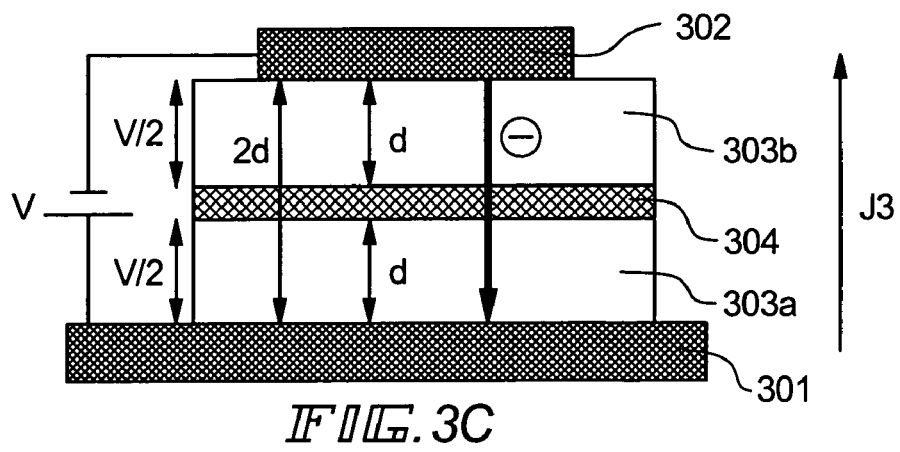

Here, It is assumed that, as shown in FIG. 3C, a floating electrode 304 is sandwiched just in the center of FIG. 3B to divide the organic compound layer 303 into a first organic compound layer 303a and a second organic compound layer 303b. At this time, the floating electrode 304 is a layer only for making an electron pass as shown in the figure if there is almost no electron injecting barrier to the first organic compound layer 303a while hole injecting barrier to the second organic compound layer 303b is extremely high.

Since the first organic compound layer 303a and the second organic compound layer 303b are composed of quite the same material, electric current density J3 in this case is expressed by the following Formula 4;

$$J3 = \alpha \cdot (V/2)^2/d^3 = \alpha/4 \cdot V^2/d^3 \quad \text{[Formula 4]}$$

As set forth above, even in the case that the simplest model is considered, it is possible to make double electric current flow compared to FIG. 3B if only the floating electrode 304 is sandwiched. Namely, if the same voltage V is applied in each structure of FIGS. 3A to 3C, the relation of J1>J2>J3 is obtained according to Formulas 2 to 4.

Figure 4A:
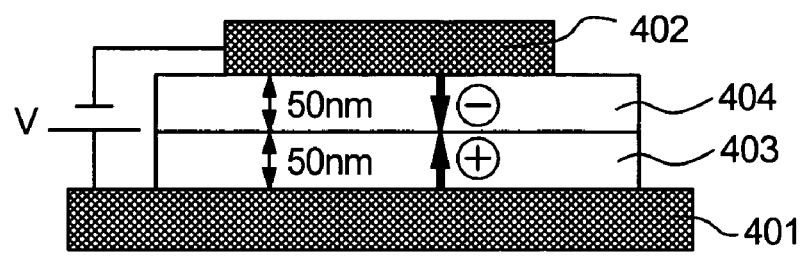
FIGS. 4A–4C are views showing a working mechanism of the present invention.
Figure 4B:
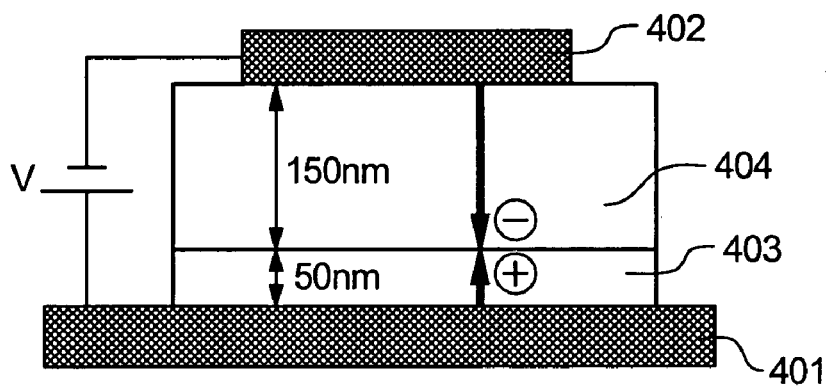
Figure 4C:
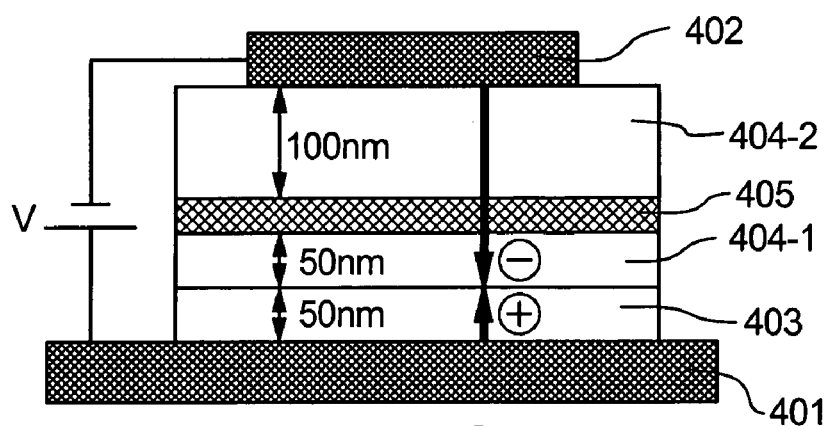

In FIGS. 4A to 4C, a conventional EL element, an EL element that has a double film thickness to the conventional EL element, and an EL element according to the present invention are compared, based on this concept. FIG. 4A shows the conventional EL element in which a hole transporting layer 403, electron transporting layer 404, and a cathode 402 are laminated on an anode 401. Either the hole transporting layer 403 or the electron transporting layer 404 may make a contribution to emission of light.

On the other hand, the EL element in FIG. 4B has a double film thickness to FIG. 4A and only what is different from FIG. 4A is another 100 nm of electron transporting layer 404 formed in order to be compared to FIG. 4C later. Because of the film thickness of FIG. 4B, almost no electric current flows and only faint emission of light is obtained (Since only the electron transporting layer becomes thick, there is naturally existed a phenomenon that a carrier-balance is collapsed or that a change of an optical path makes emission of light faint, which is not considered here. It is considered that the decrease of flowing electric current has a serious influence on emission of light rather than the above phenomenon).

Here, FIG. 4C shows the EL element according to the present invention (the structure shown in FIG. 1), in which a floating electrode 405 is inserted into the electron transporting layer 404 of FIG. 4B to be divided into a first electron transporting layer 404-1 and a second electron transporting layer 404-2. In other words, the second electron transporting layer and the electrode are further laminated on the device of FIG. 4A.

At this time, when the floating electrode 405 is made to have the same function as that of the floating electrode 304 described in FIG. 3C, only what the second electron transporting layer 404-2 does is transporting an electron to have no contribution to emission of light. Then, according to an analogy to the contents described with FIG. 3C, more electric current is made to flow compared to FIG. 4B. Accordingly, it is possible to made electric current flow to some extent and ensure emission of light if a film thickness is made thick. The second electron transporting layer 404-2 at this time is corresponding to an electron transport supporting layer in the present invention.

In this case that the simplest model is considered, of course, an amount of electric current flowing in the device of FIG. 4C according to the present invention is much smaller compared to an amount of electric current flowing in the conventional device of FIG. 4A. Therefore, emission of light becomes faint in accordance with the small amount of electric current. In fact, however, it is found that FIG. 4C considerably makes an approach to FIG. 4A in characteristics rather than FIG. 4B as described in an embodiment later. It is considered that this is because electric current flowing in an actual EL element is not electric current in accordance with simple Child's Law but more complicated electric current (Specifically, TCLC: Trap Charge Limited Current limited by a trap of a carrier).

It is noted that such concept is properly applied to a hole transporting layer side, that is, to be the structure such as an anode/a hole transport supporting layer/a floating electrode/an electroluminescent film/a cathode. However, it is more effective to insert a floating electrode into an electron transporting layer like FIG. 4C according to the present invention since it is generally more difficult to transport an electron in an organic compound.

With further improvement based on the above-mentioned mechanism, it is found that there is a possibility for occurring as it were a reversal phenomenon that electric current is easier to flow (that is, it is possible to operate with a low voltage) in the device FIG. 4C than FIG. 4A in spite of the thicker film thickness of the device of FIG. 4C. This phenomenon is achieved by introducing a hole blocking material somewhere between the anode 401 and the cathode 402 in the device structure of FIG. 4C. It is in the case of introducing a hole blocking material in the second electron transporting layer 404-2 (that is, an electron transport supporting material in the present invention) that a drive voltage is made to lower most.

Although it is difficult to explain this phenomenon simply, the present inventors consider as follows. When a hole blocking material is introduced, a hole carrier is effectively blocked to be stored locally. Specifically, in the case of introducing a hole blocking material to the electron transport supporting layer, a large amount of hole carriers are locally stored since the floating electrode 405 is conductive. According to an internal electric field caused by the stored hole carriers, electrons are effectively transported or injected in to the electroluminescent film. As a result, even if the device of FIG. 4C has a thicker film thickness than the conventional device of FIG. 4A, it is possible to make a drive voltage further lower than that of the conventional device of FIG. 4A.

The fundamental working mechanism of the present invention has been described above. Hereinafter, there are given preferable materials for composing the electron transport supporting layer, the floating electrode, and the electroluminescent film used in the present invention. It is noted the present invention is not limited to the materials given below.

First, as set forth above, an electron transporting material is preferable as a material composing the electron transport supporting layer, and a metal complex is often used as the electron transporting material. Examples thereof include: metal complexes that have quinoline skeleton or benzoquinoline skeleton, such as tris (8-quinolinolate) aluminum (abbrev., Alq), tris(4-methyl-8-quinolinolate) aluminum (abbrev., Almq), and bis (10-hydroxybenzo[h]-quinolinate)beryllium (abbrev., Bebq); and bis(2-methyl-8-quinolinolate)-(4-hydroxy-biphenylil)-aluminum (abbrev., BAlq) that is a mixed ligand complex. The examples also include metal complexes that have an oxazole-based or a thiazole-based ligand such as bis[2-(2-hydroxypheyl)-benzooxazolate]zinc (abbrev., $Zn(BOX)_2$) and bis[2-(2-hydroxypheyl)-benzothiazolate]zinc (abbrev., $Zn(BTZ)_2$). In addition to the metal complexes, other materials that are capable of transporting electrons are: oxadiazole derivatives such as 2-(4-biphenylyl)-5-(4-tert-butylphenyl)-1,3,4-oxadiazole (abbrev., PBD) and 1,3-bis[5-(p-tert-butylphenyl)-1,3,4-oxadiazole-2-il]benzene (abbrev., OXD-7); triazole derivatives such as 3-(4-tert-butylphenyl)-4-phenyl-5-(4-biphenylyl)-1,2,4-triazole (abbrev., TAZ) and 3-(4-tert-butylphenyl)-4-(4-ethylpheyl)-5-(4-biphenylyl)-1,2,4-triazole (abbrev., p-EtTAZ); and phenanthroline derivatives such as bathophenanthroline (abbrev., BPhen) and bathocuproin (abbrev., BCP).

Further, a hole blocking material is preferable as the material composing the electron transport supporting layer, and there are given the above-mentioned materials such as PBD, OXD-7, TAZ, p-EtTAZ, Bphen, and BCP. Especially, organic compounds that have phenanthroline skeleton, such as Bphen and BCP, have a high hole blocking property. In addition, a 5-coordinate metal complex that has as a central metal an element belonging to group 13 of the periodic table, represented by the above-mentioned BAlq, is preferable from the viewpoint of stability of a film quality.

As the floating electrode, it is possible to use one of a metal thin film, a metal oxide thin film, and an organic conductive thin film, or a combination thereof Specifically, it is preferable that the floating electrode is composed of a conductor with a work function less than 3.5 eV since it is necessary to inject an electron into an electroluminescent film, and one element of an alkaline metal, an alkaline-earth metal, and a rare earth metal, or an alloy containing the metal element may be used. There are given as examples an Mg:Ag alloy, an Al:Li alloy, Ba, Ca, Yb, and Er. The floating electrode may have a structure composed of a film of metal such as Al and a thin film of an inorganic dielectric such as lithium fluoride, a thin film of a metal oxide such as lithium oxide, or an organic thin film including alkaline metal or alkaline-earth metal. In addition, the floating electrode may not be of a film but of a cluster.

For the electroluminescent film, a structure and a material, generally used for an EL element, may be used. There are various variations on the structure of the electroluminescent film, specifically such as a laminate structure of a hole transporting layer and an electron transporting layer, a single-layered structure of a polymer compound, a high efficiency device which utilizes emission form a triplet excitation state, as described in Reference 1.

As a material for the anode, transparent conductive inorganic compound such as ITO (Indium Tin Oxide) and IZO (Indium Zinc Oxide) are often used if light is taken out of the anode side. A super-thin film such as gold can be used. In the case of using a non-transparent material, (in the case of taking light out from the cathode side), a material such as a metal, an alloy, or a conductor that has a work function large to some extent without transmitting light may be used, and there are given W, Ti, and TiN. Further, it is better to be formed with sputtering if a material that has a high melting point is used.

It is preferable that the cathode is composed of a conductor that has a work function less than 3.5 eV, and one element of an alkaline metal, an alkaline-earth metal, and a rare earth metal, or an alloy containing the metal element can be used as a material for the cathode. There are given as examples a Mg:Ag alloy, Al:Li alloy, Ba, Ca, Yb, and Er. The cathode may have a structure composed of a film of metal such as Al and a thin film of an inorganic dielectric such as lithium fluoride, a thin film of a metal oxide such as lithium oxide, or an organic thin film including alkaline metal or alkaline-earth metal. In the case of applying a hole blocking material to an electron transport supporting material, a generally used metal such as Al may be used. In addition, the cathode may be formed with sputtering.

Figure 1:
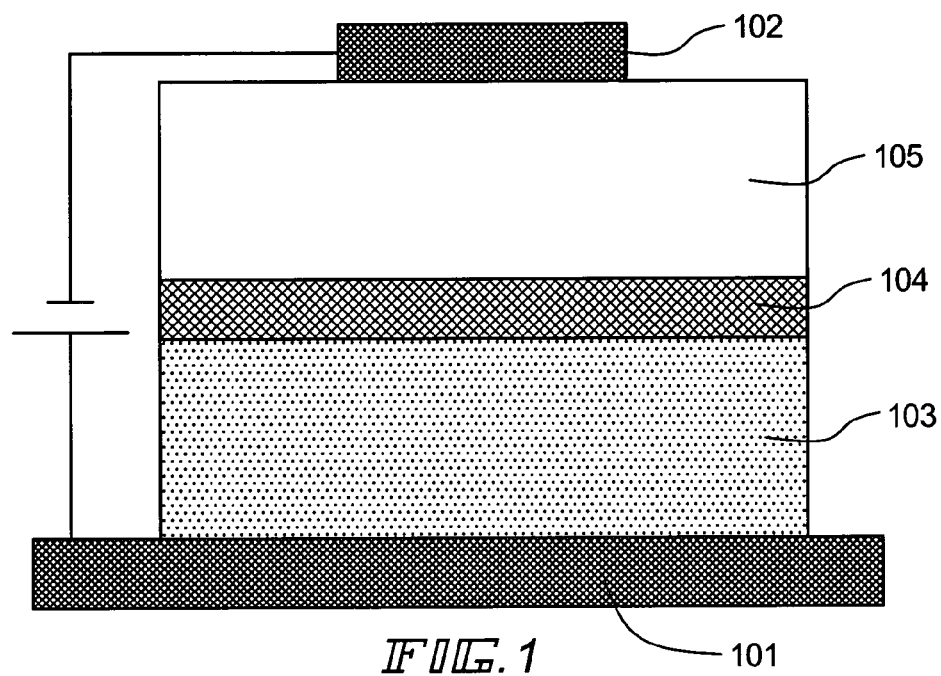
FIG. 1 is a view showing a basic structure of the present invention.

In the case of taking light out from the cathode side, a super-thin film of the above material for the cathode may be used, and further, an ITO film formed with sputtering may be used especially in the structure in which a film as the cathode is lastly formed like FIG. 1. At this time, although it is preferable that ITO is subjected to sputtering after a film of CuPc is formed, there is little damage to a light emitting region without CuPc since the electron transport supporting layer is thick.

There have been described above on materials used for an EL element according to the present invention. Next, there will be explained a specific example of manufacturing an EL element or a light emitting device that uses an EL element with a multi-chamber fabrication system that is capable of automating all processes from deposition to sealing.

Figure 5:
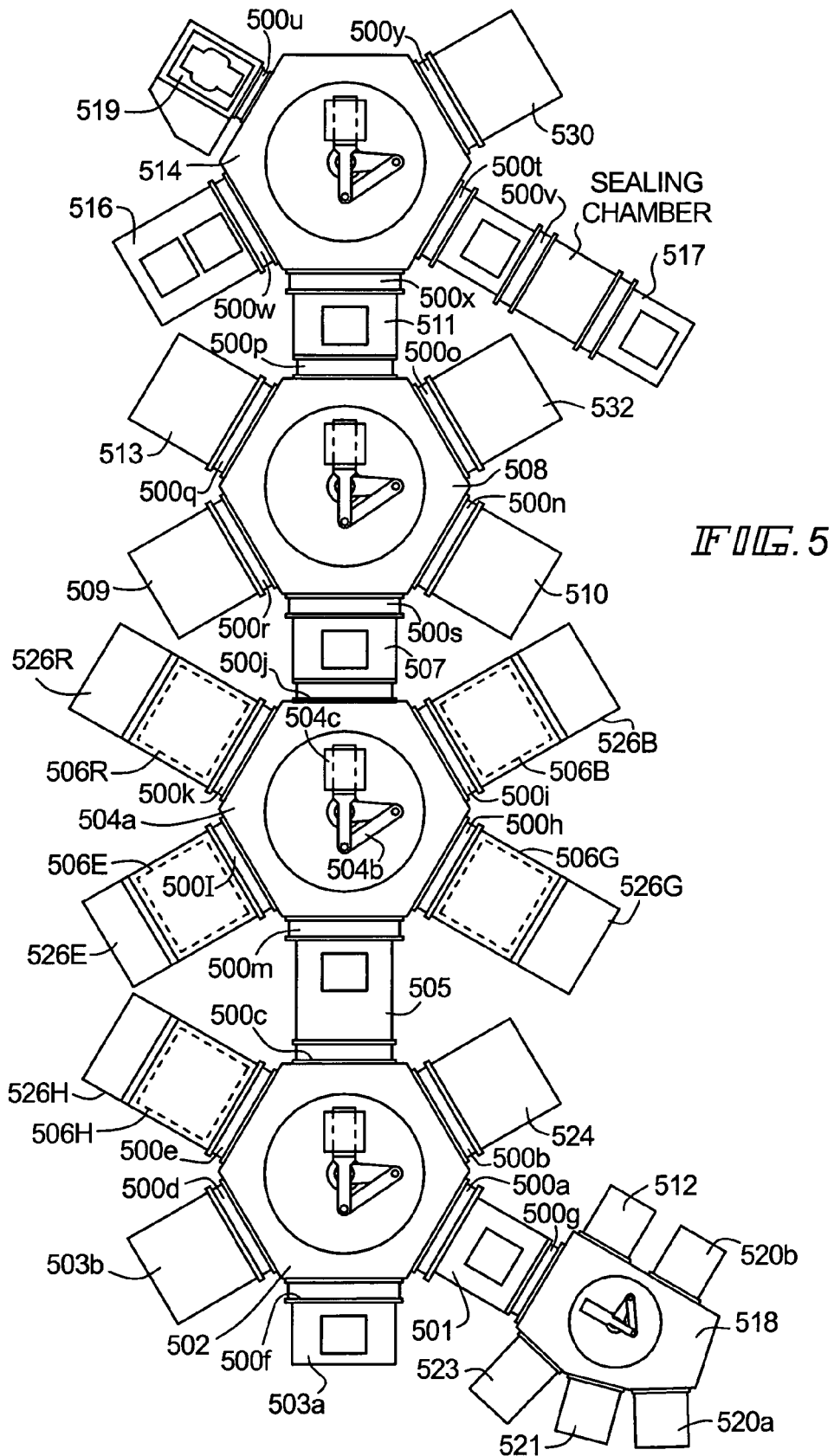
FIG. 5 is a view showing a fabrication system of an EL element and a light emitting device using an EL element.

FIG. 5 shows a multi-chamber fabrication system that has gates 500$a$ to 500$y$, transferring chambers 502, 504$a$, 508, 514, and 518, delivering chambers 505, 507, and 511, a preparing room 501, a first deposition chamber 506H, a second deposition chamber 506B, a third deposition chamber 506G, a fourth deposition chamber 506R, a fifth deposition chamber 506E, other deposition chambers 509, 510, 512, 513, and 532, setting chambers for setting evaporation sources 526R, 526G, 526B, 526E, and 526H, pretreatment chambers 503$a$ and 503$b$, a sealing chamber 516, a mask stock chamber 524, a sealing substrate stock chamber 530, cassette chambers 520$a$ and 520$b$, a stage for putting on a tray 521, and a takeout chamber 519. It is noted that a transferring mechanism 504$b$ for transferring a substrate 504$c$ is provided with the transferring chamber 504$a$ and a transferring mechanism is provided similarly with each of the other transferring chambers.

Hereinafter, there will be explained with an example a procedure for carrying a substrate, in which an anode and an insulator (a bank) for covering an edge portion of the anode are in advance provided, into the fabrication system shown in FIG. 5 and manufacturing an EL element or a light emitting device that uses an EL element. As an example of the case that the light emitting device that uses the EL element, for, example, a substrate for an active matrix light emitting device, in which a plurality of thin film transistors (electric current controlling TFTs) connected to the anode, other plurality of transistors such as switching TFTs, and a drive circuit composed of thin film transistors are provided in advance, may be used.

First, the above substrate is set in the cassette chamber 520$a$ or the cassette chamber 520$b$. In the case of a large-sized substrate (for example, 300 mm×360 mm), the substrate is set in the cassette chamber 520$a$. In the case of a normal substrate (for example, 127 mm×127 mm), the substrate is transferred to the stage for putting on the tray 521 to set a plurality of substrates in a tray (for example, 300 mm×360 mm) after setting in the cassette chamber 520$a$.

The set substrate (in which an anode and an insulator for covering an edge portion of the anode are provided) is transferred to the transferring chamber 518.

It is preferable to wash a surface of the anode with a porous sponge, typically of a material such as PVA (polyvinyl alcohol) or nylon, soaked in a surfactant (weak alkaline) to remove dust on the surface before setting in the cassette chamber in order to reduce point defects. As a washing mechanism, a washing equipment with a roll brush of PVA that spins round a parallel axis to a face of a substrate to come in contact with a surface of the substrate, or a washing equipment with a disc brush of PVA that spins round a perpendicular axis to a face of a substrate to come in contact with a surface of the substrate may be used. Further, it is preferable to perform annealing for degassing in vacuo before forming a film containing an organic compound in order to remove water and other gas contained in the above substrate, and annealing may be performed to in a baking chamber 523 connected to the transferring chamber 518. In addition, an UV irradiation mechanism may be provided with the baking chamber 523 in order to perform irradiation of ultraviolet light as treatment of a surface of the anode.

Further, a hole injecting layer of a polymer material may be formed by ink-jet or spin-coating in the deposition chamber 512. With putting the substrate vertically, the hole injecting layer may be formed with ink-jet in vacuo. A material that functions as a hole injecting layer (an anode buffer layer), such as poly(ethylenedioxythiphene)/polystyrenesulphonic acid (PEDOT/PSS), camphor sulfonic acid in polyaniline (PANI/CSA), PTPDES, Et-PTPDEK, or PPBA may be entirely applied on the anode and baked. It is preferable that baking is performed in the baking chamber 523. In the case of forming the hole injecting layer of a polymer material by a coating method such as spin-coating, the flatness is improved and it is possible to make a coverage and an uniformity of a film thickness better with respect to a film formed thereon. Since a film thickness of a light emitting layer becomes uniform especially, uniform emission of light can be obtained. In this case, it is preferable to perform heat treatment in vacuo (100 to 200° C.) just before deposition with evaporation after forming the hole injecting layer with the application method. The heat treatment in vacuo may be performed in the pretreatment chamber 503$b$. The following is an example; the substrate may be carried into the cassette room after a surface of the anode is washed with a sponge, transferred into the deposition room 512 to apply poly(ethylenedioxythiphene)/polystyrenesulphonic acid (PEDOT/PSS) entirely with spin-coating to have a film thickness of 60 nm, transferred into the baking room 523 to pre-bake at 80° C. for 10 minutes and bake at 200° C. for 1 hour, transferred into the pretreatment chamber 503$b$ to perform heat treatment in vacuo (heating at 170° C. for 30 minutes and cooling for 30 minutes) just before evaporation, and transferred into the deposition chambers 506R, 506G, and 506B to form a light emitting layer with evaporation without exposing to the air. Especially, in the case of using an ITO film as a material for the anode so that a surface is uneven and minute particles exist on the surface, it is possible to reduce the influence if the thickness of PEDOT/PSS is set to be more than 30 nm.

Since PEDOT/PSS applied on the ITO film does not have a good wettability, it is preferable to perform washing with pure water once after the first application of PEDOT/PSS solution by spin-coating to improve wettability, and to perform the second application of PEDOT/PSS solution with spin-coating and baking to form an uniform film. It is noted that it is possible to obtain an effect that minute particles and the like are removed in addition to the improved surface when washing with pure water once after the first application is performed.

Next, the substrate is transferred from the transferring chamber 518 provided with a transferring mechanism to the preparing chamber 501. In the fabrication system in the present embodiment mode, a substrate reverse mechanism is provided in the preparing chamber 501 and it is possible to reverse the substrate appropriately.

Then, the substrate is transferred to the transferring chamber 502 connected to the preparing chamber 501. It is preferable to introduce inert gas to become the atmospheric pressure in the preparing chamber 501 connected to an evacuation treatment chamber after performing evacuation to transfer the substrate into the transferring chamber 502. In order to prevent an impurity from being introduced into the inside of the equipment, inert gas such as nitrogen or rare gas, which is more highly purified with a gas purification machine in advance, is used as the gas introduced into the inside of the device. Therefore, it is necessary to provide a gas purification machine in order that highly purified gas is introduced into the equipment. With the above, it is possible to remove oxygen and water contained in gas and other impurities in advance to prevent from being introduced into the equipment. In addition, it is preferable to perform evacuation in advance and keep vacuum in the transferring chamber 502 in order to reduce water and oxygen as much as possible.

For the above evacuation treatment chamber, a magnetic levitation type turbo molecular pump, a cryo-pump or a dry pump is provided. Accordingly, it is possible to make the degree of vacuum reach $10^{-5}$ to $10^{-6}$ Pa in the transferring chamber connected to the preparing chamber and control reverse diffusion of an impurity from the pump side and the exhaustion system.

In the case of forming a hole transporting layer entirely by spin-coating, it is preferable a portion of the layer on an edge and a periphery of the substrate, a terminal portion, a connecting region of a cathode and a lower wiring is selectively removed with $O_2$-ashing, laser or the like in the pretreatment chamber 503a.

Further, it is preferable to perform heat treatment in vacuo just before evaporation of a electroluminescent film in order to prevent a phenomenon (shrink) of expanding a non-light emitting region from a peripheral portion of a pixel, and the substrate is transferred to the pretreatment chamber 503b and annealing for degassing is performed in vacuo, less than $5 \times 10^{-3}$ Torr (0.665 Pa), preferably $10^{-4}$ to $10^{-6}$ Pa, in order to remove water and other gas contained in the above substrate drastically. In the pretreatment chamber 503a, a flat-plane heater (typically, a heater) is used to heat a plurality of substrates uniformly. Especially, in the case of using an organic resin film as a material for an inter-layer insulating film or a bank, it is effective to perform heat treatment in vacuo before forming an electroluminescent film since water is likely to be adsorbed and there is a threat of generating degassing. In the heat treatment in vacuo, adsorbed water is removed by heating at 100 to 250° C., preferably 150 to 200° C., for more than 30 minutes, for example, and then performing natural cooling for 30 minutes.

After performing the above heat treatment in vacuo, the substrate may be transferred to the deposition chamber 506H to form a film of a hole injecting layer or a hole transporting layer.

Next, the substrate is transferred from the transferring chamber 502 to the delivering chamber 505, and then transferred from the delivering chamber 505 to the transferring chamber 504a without exposing to the air.

After that, the substrate is appropriately transferred into the deposition chambers 506R, 506G, 506B, and 506E to form an electroluminescent film composed of layers such as a light emitting layer, an electron transporting layer, and an electron injecting layer.

Here, description will be given on the deposition chamber 506R, 506G, 506B, 506E, and 506H.

In each of the deposition chamber 506R, 506G, 506B, 506E, and 506H, a plurality of movable evaporation source holders are set up. A crucible into which an EL material is sealed is appropriately provided for each of the plurality of movable evaporation source holders. In order to perform deposition selectively, the substrate is set face down, a positional alignment of an evaporation mask is performed with CCD or the like, and evaporation is performed with resistance heating. The evaporation mask is stoked in the mask stock chamber 524, and transferred appropriately to the deposition chamber in performing evaporation.

It is preferable to use a manufacturing system shown below for setting EL materials up in these deposition chambers. That is, it is preferable to perform deposition with using a container (typically, a crucible) into which an EL material is put in advance by a material maker. In addition, it is preferable to perform setting up without exposing to the air, and to introduce the crucible in an airtight container in transferring from the material maker into the deposition chamber. Desirably, the setting chambers with evacuation means 526R, 526G, 526B, 526H, and 526E, connected to the respective deposition chambers 506R, 506G, 506B, 506H, and 506E, is made in vacuo or in an inert gas atmosphere. The crucible is taken out of the airtight container in the setting chamber to be set in the deposition chamber. It is possible to prevent the crucible and the EL material put in the crucible from contamination. Further, a metal mask can be stocked in each of the setting chamber 526R, 526G, 526B, 526H, and 526E.

When an EL material set in each of the deposition chambers 506R, 506G, 506B, 506H, and 506E is appropriately selected, it is possible to form an EL element that emits light of a single color (specifically, white) or light of a full color (specifically, red, green, and blue). In the case of forming an EL element for green, for example, a hole transporting layer or a hole injecting layer formed in the deposition chamber 506H, a light emitting layer (G) formed in the deposition chamber 506G, and an electron transporting layer or an electron injecting layer formed in the deposition chamber 506E, may be laminated in order, and then a cathode may be formed to obtain the EL element for green. Further, in the case of forming an EL element for a full color, for example, a hole transporting layer or a hole injecting layer, a light emitting layer (R), and an electron transporting layer or an electron injecting layer may be laminated with an evaporation mask for red in the deposition chamber 506R, a hole transporting layer or a hole injecting layer, a light emitting layer (G), and an electron transporting layer or an electron injecting layer may be laminated with an evaporation mask for green in the deposition chamber 506 G, a hole transporting layer or a hole injecting layer, a light emitting layer (B), and an electron transporting layer or an electron injecting layer may be laminated with an evaporation mask for blue in the deposition chamber 506B, and then a cathode may be formed to obtain the EL element for a full color.

In the case of laminating light emitting layers for emitting different colors, an electroluminescent layer that emits light of white is classified into a three-wavelength type containing three primary colors of red, green, and blue or a two-wavelength type using a relation of a complementary color such as blue/yellow or bluish green/orange. It is possible to form an EL element for white in one deposition chamber. For example, in the case of obtaining an EL element for white in the three-wavelength type, a plurality of evaporation source holders are prepared in one deposition chamber, and the first evaporation source holder that has (TPD)

sealed, the second evaporation source holder that has p-EtTAZ sealed, the third evaporation source holder that has $Alq_3$ sealed, the fourth evaporation source holder that has an EL material (in which a pigment for emitting red is added to $Alq_3$) sealed, the fifth evaporation source holder that has $Alq_3$ sealed are set in the deposition chamber. Then, the first to fifth evaporation source holders are started to move in order, evaporation is performed to a substrate, and layers are laminated. Specifically, TPD is subjected to heating and sublimated from the first evaporation source holder to perform evaporation to the entire substrate. Then similarly, p-EtTAZ, $Alq_3$, $Alq_3$: NileRed, and $Alq_3$ are respectively sublimated from the second to fifth evaporation source holders to perform evaporation to the entire substrate. After that, a cathode is formed to obtain the EL element for white.

After an electroluminescent layer is laminated appropriately in accordance with the above process, the substrate is transferred from the transferring chamber 504a to the delivering chamber 507 and transferred from the delivering chamber 507 to the transferring chamber 508 without exposing to the air.

Next, the substrate is transferred to the deposition chamber 510 by the transferring mechanism set within the transferring chamber 508 to form a floating electrode, which is a metal film (an alloy such as MgAg, MgIn, $CaF_2$, LiF, or $Ca_3N_2$, a film formed with co-evaporation of aluminum and an element belonging to group 1 or 2 of the periodic table, or a laminate film of the above) formed with evaporation that uses resistance heating.

Further, the substrate is transferred to the deposition chamber 532 to form an electron transport supporting layer. As a material used at this time, a hole blocking material such as BCP or BAlq is preferable. After forming the electron transport supporting layer, a film as a cathode is formed. The cathode may be formed with evaporation in the above-mentioned deposition chamber 510 or with sputtering in the deposition chamber 509.

In the case of manufacturing a top-emission type light emitting device, it is preferable that the cathode is transparent or translucent and a thin film (1 to 10 nm) of the above metal film or a laminate of a thin film (1 to 10 nm) of the above metal film and a transparent conductive film is to be the cathode. In this case, a film of a transparent conductive film (ITO: an alloy of indium oxide and tin oxide, $In_2O_3$—ZnO: an alloy of indium oxide and zinc oxide, or ZnO: zinc oxide) may be formed with sputtering in the deposition chamber 509.

In accordance with the above process, the EL element of the present invention is formed.

In addition, the substrate may be transferred to the deposition chamber 513 connected to the transferring chamber 508 to form a protective film of a silicon nitride film or a silicon oxynitride film for sealing. Here a target of silicon, silicon oxide, or silicon nitride is provided in the deposition chamber 513. For example, when the target of silicon is used and the atmosphere in the deposition chamber is made to be a nitrogen atmosphere or an atmosphere containing nitrogen and argon, a silicon nitride film can be formed on the cathode. Further, a thin film containing carbon as its main component (a DLC film, a CN film, or an amorphous carbon film) may be formed as the protective film, and another deposition chamber with CVD may be provided. The diamond-like carbon (also called the DLC film) can be formed with a method such as plasma CVD, (typically, RF plasma CVD, microwave CVD, electron cyclotron resonance (ECR) CVD, or hot filament CVD), combustion-flame, sputtering, ion beam evaporation, or laser evaporation, reaction gas used for the deposition that is composed of hydrogen gas and hydrocarbon gas (for example, $CH_4$, $C_2H_2$, or $C_6H_6$) is subjected to ionization with glow discharge, and ions are accelerated for collision against a cathode to which negative self-bias is applied to perform the deposition. The CN film may be formed with using $C_2H_4$ gas and $N_2$ gas as reaction gas. It is noted that the DLC film and the CN film are transparent or translucent insulating films to visible light. To be transparent to visible light indicates that transmissivity of visible light is 80 to 100%, and to be translucent to visible light indicates that transmissivity of visible light is 50 to 80%.

Next, the substrate with the EL element formed is transferred from the transferring chamber 508 to the delivering chamber 511 without exposing to the air, and then transferred from the delivering chamber 514 to the sealing chamber 516.

A sealing substrate is set in a load chamber 517 to be prepared. It is preferable to perform annealing in vacuo in advance in order to remove impurities such as water and the like. In the case of forming a sealing material on the sealing substrate for bonding to the substrate with the EL element provided, the sealing material is formed in a sealing chamber and the sealing substrate with the sealing material formed is transferred to the sealing substrate stock chamber 530. A desiccant may be provided for the sealing substrate in the sealing chamber. Although the example of forming the sealing material on the sealing substrate is shown here, there is no limitation. A sealing material may be formed on the substrate with the EL element formed.

Next, the substrate and the sealing substrate are bonded in the sealing chamber 516 and UV light is irradiated to a pair of substrates bonded with an ultraviolet light irradiation mechanism provided in the sealing chamber 516 to cure the sealing material. Although ultraviolet light curable resin is used as the sealing material here, the present invention is not specifically limited providing that the sealing material is an adhesive.

Then, the pair of substrates bonded is transferred from the sealing chamber to the transferring chamber 514, and transferred from the transferring chamber 514 to the takeout chamber 519 to be taken out.

As set forth above, it is possible to fabricate a light emitting device with a high reliability since the fabrication system shown in FIG. 5 is used to avoid exposing an EL element to the air until sealing in an airtight space completely. Although it is repeated in the transferring chamber 514 and 518 to be in vacuo and in an atmospheric pressure of nitrogen, it is preferable to keep vacuum all the time in the transferring chamber 502, 504a, and 508.

It is noted that control equipment for realizing automation of a route for transferring a substrate into each treatment chamber, which is not shown in the figure here, is provided.

With the fabrication system shown in FIG. 5, it is also possible to form a top-emission (or both-emission) type EL element if the substrate provided with a transparent conductive film or a metal film (TiN) as an anode is transferred and a transparent or translucent cathode (for example, a laminate of a thin metal film such as Al or Ag and a transparent conductive film) is formed after forming an electroluminescent film, a floating electrode, and an electron transport supporting layer. The top-emission type EL element indicates a device in which emission of light generated in the electroluminescent film is transmitted through the cathode to be taken out.

Further, it is also possible to form a bottom-emission type EL element with the fabrication system shown in FIG. 5 if the substrate provided with a transparent conductive film as an anode is transferred and a cathode of a metal film (Al or Ag) is formed after forming an electroluminescent film, a floating electrode, and an electron transport supporting layer. The bottom-emission type EL element indicates a device in which emission of light generated in the electroluminescent film is taken out of the anode to a TFT ant transmitted to the substrate.

EMBODIMENT 1

An EL element according to the present invention shown in FIG. 1 will be specifically described in this embodiment.

First, copper phthalocyanine (abbrev., CuPc) as a hole injecting material is deposited to have 20 nm in thick, 4,4'-bis(N-(1-naphthyl)-N-phenyl-amino)-biphenyl (abbrev., α-NPD) is deposited to have 30 nm in thick, and Alq as an electron transporting material is deposited to have 50 nm in thick in this order on a substrate on which ITO is deposited having 110 nm as an anode 101. The above is an electroluminescent film 103.

Second, calcium fluoride to have 2 nm in thick and aluminum to have 20 nm in thick are deposited to fabricate a floating electrode 104. In addition, Alq is deposited to have a thickness of 100 nm as an electron transport supporting layer 105. Lastly, calcium fluoride having 2 nm in thick and aluminum having 100 nm in thick are deposited as a cathode 102. Then, an EL element according to the present invention can be completed. The device is corresponded to the illustrated device structure in FIG. 4C so that it is referred to as device C hereinafter. Further, the size of a pixel is 2-mm-square.

Figure 6A:
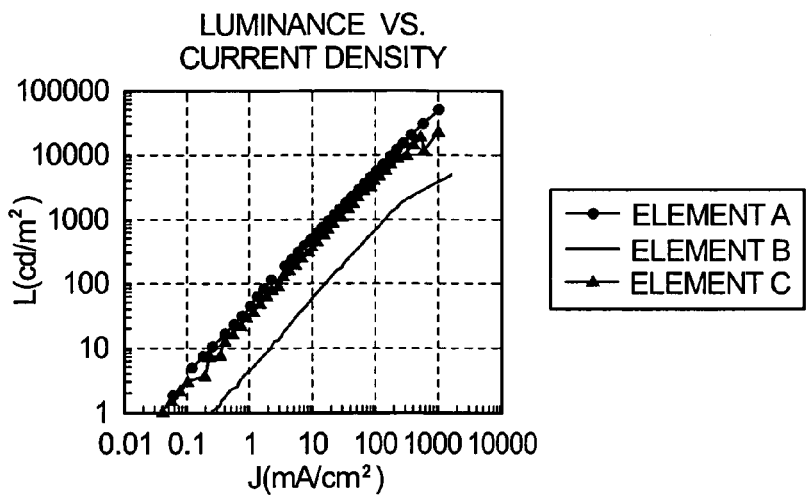
FIGS. 6A–6C are views showing a data of Embodiment 1 and Comparative Example 1.
Figure 6B:
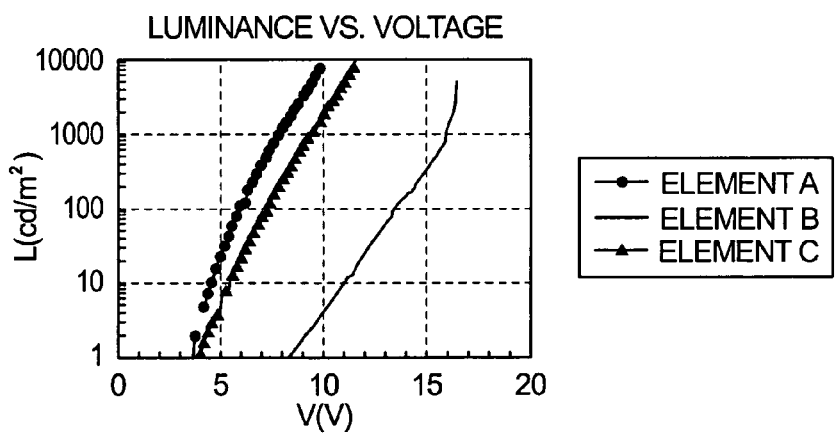
Figure 6C:
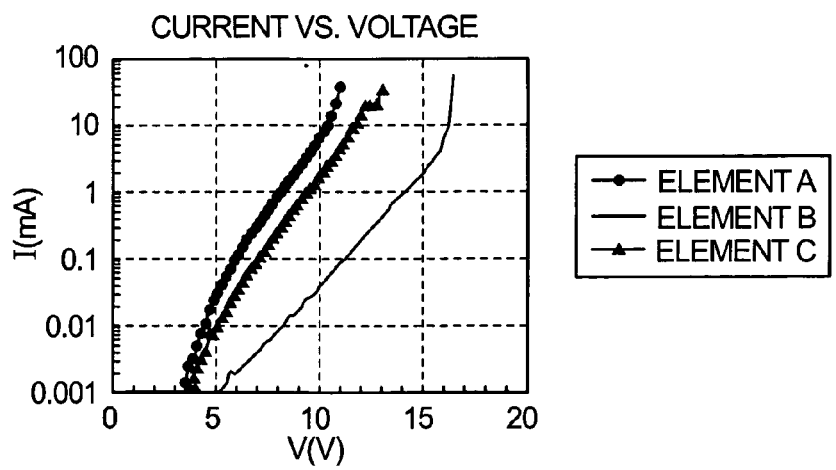

FIGS. 6A–6C show the initial characteristics of the device C (from the top, luminance-current density; luminance-voltage; and current-voltage). It shows that a certain degree of current can be applied in spite of being thick to the device C and light can be emitted.

COMPARATIVE EXAMPLE 1

For comparison to Embodiment 1, two kinds of devices are fabricated. First, conventional EL element that has the structure of "ITO (110 nm), CuPc (20 nm), α-NPD (30 nm), Alq (50 nm), $CaF_2$ (2 nm), Al (100 nm)" is fabricated. The device is corresponded to the illustrated device structure in FIG. 4A and referred to as the device A hereinafter. In addition, the size of a pixel is 2-nm-square.

The EL element in which a floating electrode is not deposited different from a device structure according to Embodiment 1 that has the structure "ITO (110 nm), CuPc (20 nm), α-NPD (30 nm), Alq (150 nm), $CaF_2$ (2 nm), Al (100 nm)" is fabricated. The device is corresponded to the illustrated device structure in FIG. 4B and referred to as the device B hereinafter. In addition, the size of a pixel is 2-nm-square.

The initial characteristics of the device A and device B is illustrated in addition to that of the device C in FIG. 6. The device C can be greatly improved its characteristics as compared with the device B but inferior to the element A. Thus, according to the present invention, it is realized that the device according to the present invention can be driven at a certain degree of voltage in spite of being thick.

EMBODIMENT 2

In this embodiment, an EL element according to the present invention shown in FIG. 1 will be specifically described. This embodiment will be described two examples that an EL element according to the present invention in which a hole blocking material is introduced into an electroluminescent film (hereinafter, an element D) and an EL element according to the present invention in which a hole blocking material is introduced into an electron transport supporting layer (hereinafter, an element E).

The structure of the device D is "ITO (110 nm), CuPc (20 nm), α-NPD (30 nm), Alq (40 nm), BCP (10 nm), $CaF_2$ (2 nm), Al (20 nm), Au (20 nm), Alq (100 nm), $CaF_2$ (2 nm), Al (100 nm)". The structure of the device E is "ITO (110 nm), CuPc (20 nm), α-NPD (30 nm), Alq (50 nm), $CaF_2$ (2 nm), Al (20 nm), BCP (100 nm), Al (100 nm)". Hole blocking materials for the device D and device E are BCP. In addition, in either device, the size of the pixel is 2-nm-square.

Figure 7A:
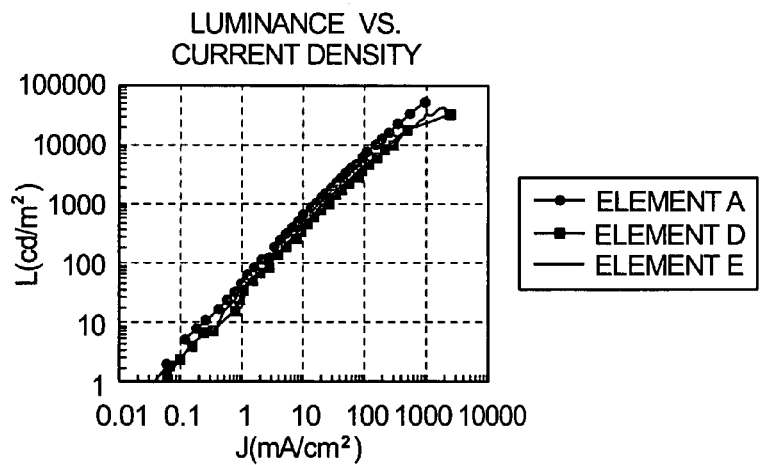
FIGS. 7A–7C are views showing a data of Embodiment 2 and Comparative Example 2.
Figure 7B:
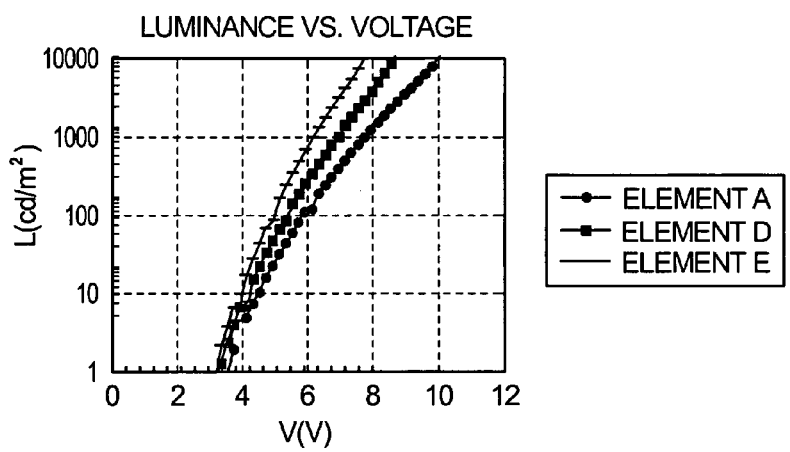
Figure 7C:
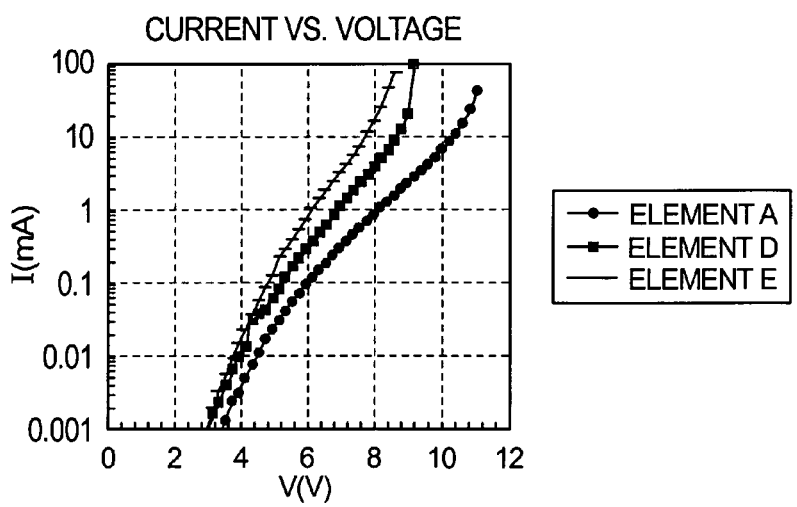

FIGS. 7A–7C show these initial characteristics (from the top, luminance-current density; luminance-voltage; and current-voltage). Regardless that both devices are thick having a thickness of approximately 200 nm, enough current can be applied thereto, and light can be emitted by enough low drive voltage. Since the characteristic of the device E is greater than that of the device D, it is realized that a hole blocking material is better for introducing into the electron transport supporting layer than the electroluminescent film.

COMPARATIVE EXAMPLE 2

For comparison, the data of device A is illustrated in FIG. 7. It can be seen from the diagram that the drive voltage is reduced compared to that of the conventional EL element regardless of being twice thicker than the conventional EL element by introducing a hole blocking material into the EL element according to the present invention. Particularly, the drive voltage at the side of high luminance is reduced largely. As revealed in current-voltage characteristics, the gradient of the diode characteristic rises precipitously (current is easily applying at the high voltage area).

Thus, even if the device is formed to be thick, it can be driven at lower voltage than the conventional device by implementing the present invention.

EMBODIMENT 3

Figure 2:
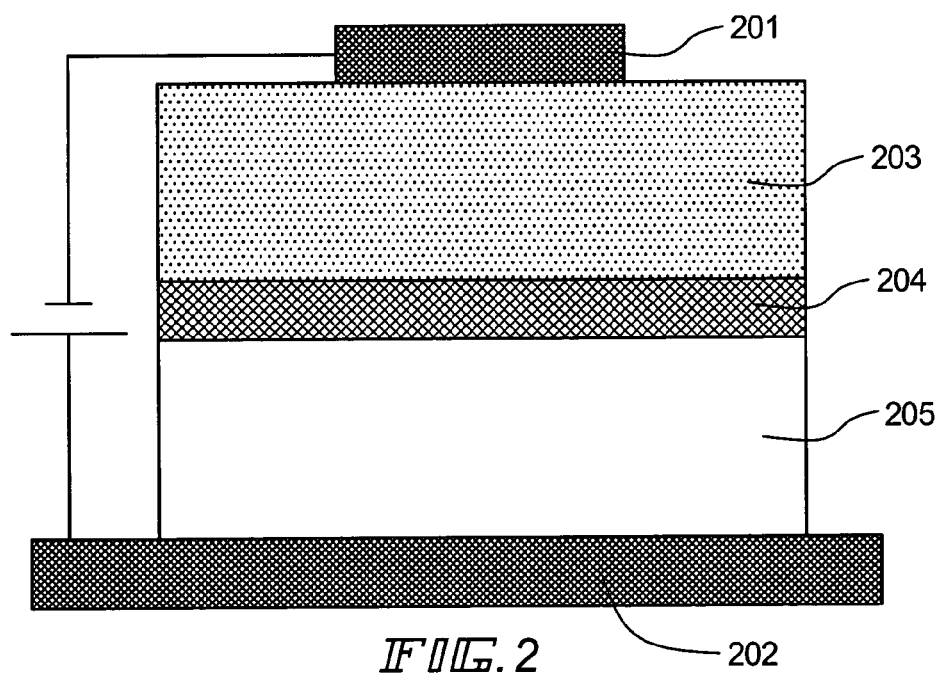
FIG. 2 is a view showing a basic structure of the present invention.

An EL element shown in FIG. 2 will be specifically described in this embodiment.

Basically, the device shown in FIG. 2 can be fabricated through the reverse process to that of FIG. 1. First, BCP is deposited to have a thickness of 100 nm as an electron transport supporting layer on the substrate on which Al is deposited to have a thickness of 100 nm as a cathode 202, and Al:Li alloy is deposited to have a thickness of 20 nm as a floating electrode 204 thereon.

Next, Alq as an electron transporting luminescent material is deposited to have a thickness of 50 nm, α-NPD as a hole transporting material is deposited to have a thickness of 30 nm, and CuPc as a hole injecting material is deposited to have a thickness of 20 nm in this order to form an electroluminescent film 203. Lastly, Au is deposited to have a thickness of 20 nm as an anode 201, and an EL element according to the present invention can be obtained. Light is extracted from the top surface (Au side) in structure according to this embodiment.

EMBODIMENT 4

An example of a light emitting device of a bottom emitting structure will be described in this embodiment. The schematic view thereof is shown in FIGS. 8A and 8B.

FIG. 8A shows a top surface view of a light emitting device. FIG. 8B shows a cross-sectional view of FIG. 8A taken along the line A–A'. Reference numeral 801 shown by dotted line is a source signal line drive circuit, 802 is a pixel portion, and 803 is a gate signal line drive circuit. In addition, reference numeral 804 is sealing substrate, 805 is a sealant containing a gap agent for keeping the space that is hermetically sealed. The inner space sealed by the sealant 805 is filled with inert air (typically, nitride). The trace quantity of moisture in the inner space sealed by the sealant 805 is eliminated by a drying agent 807 so as to the inner space be dried enough.

Reference numeral 808 is a wiring for transmit a signal inputted to a source signal line drive circuit 801 and a gate signal line drive circuit 803. They accept video signal or clock signal from FPC (flexible print circuit) 809.

Next, a cross-structure will be described referring to FIG. 8B. A driver circuit and a pixel portion are formed on a substrate 810. Here, the source signal line drive circuit 801 and the pixel portion 802 are illustrated as a drive circuit. In addition, as the source signal line drive circuit 801, CMOS circuit having an n-channel TFT 823 and a p-channel TFT 824 is formed.

A pixel portion 802 is formed from a plurality of pixels including a switching TFT 811, a current control TFT 812, and a first electrode (anode) 813 formed from a transparent conductive film connected to a drain of the current control TFT 812.

Here, the first electrode 813 is formed so as to overlap partly with a connecting electrode and electrically connected to a drain region of a TFT via the connecting electrode. It is preferable that the first electrode 813 is transparent to light and fabricated from a conductive film having large work function (indium oxide tin oxide alloy (ITO), indium oxide zinc oxide alloy ($In_2O_3$—ZnO), zinc oxide (ZnO), or the like).

At the both end portions of the first electrode (anode) 813, an insulator 814 (referred to as bank, barrier, or the like) is formed. In order to improve the coverage, the top end portion or the bottom end portion of the insulator 814 is formed to have a curvature. The insulator 814 may be covered with an aluminum nitride film, an aluminum oxynitride film, a thin film made from carbide as the major components, or a protective film made from silicon nitride film.

A layer containing an organic compound 815 is formed selectively on the first electrode (anode) 813 by vapor deposition using an vapor deposition mask or ink jet. In addition, a layer containing an organic compound 815 according to this embodiment is fabricated from the electroluminescent film 103, the floating electrode 104, and an electron transport supporting layer 105. Specifically, a structure described in Embodiment 2 may be formed. Note that it is preferable that the floating electrode be patterned on respective pixels for preventing the crosstalk.

A second electrode (cathode) 816 is formed on the layer containing an organic compound 815. Materials having small work function (Al, Ag, Li, Ca, or alloy of these materials such as MgAg, MgIn, AlLi, $CaF_2$, or $Ca_3N_2$) may be used for the cathode. Thus, an EL element 818 of the present invention comprising the first electrode (anode) 813, the layer containing an organic compound 815, and the second electrode (cathode) 816 can be formed. The EL element 818 emits light outside in the direction indicated by an arrow as shown in FIG. 8. The EL element 818 is a kind of generating monochrome luminance R, G, or B. The full color can be achieved by forming altogether three devices in which each layer containing an organic compound that emits luminance of R, G, or B is respectively formed.

A protective layer 817 is formed to seal the EL element 818. The protective layer 817 is preferable to be fabricated from an insulating film that is made from silicon nitride or silicon oxynitride as major components by sputtering (DC method or RF is method) or PCVD, thin film (DCL film, CN film, or the like), or a laminating layer thereof. If the silicon nitride film is formed in an atmosphere containing nitride and argon using silicon target, the silicon nitride film with a high blocking effect against impurities such as moisture or alkali metals can be formed. In addition, nitride silicon target can also be used. Further, the protective layer can be formed using a film formation system using remote plasma.

The sealing substrate 804 is bonded with the protective layer 817 using the sealant 805 in an inert gas atmosphere to seal the EL element. A projection portion is formed on the sealing substrate 804 by sand blast in advance. And the drying agent is pasted therein. In addition, a preferable material for the sealant 805 is an epoxy resin. It is preferable that the sealant 805 is made form the material that does not transmit as much as possible the moisture and the oxygen.

For the material of the sealing substrate 804, a metal substrate, a glass substrate, a quartz substrate, a plastic substrate made from FRP (Fiberglass-Reinforced Plastics), PVF (polyvinyl fluoride), Myler, polyester, acryl, or the like, can be used. Besides, a drying agent pasted metal can on its inside surface can be used for sealing the EL element.

Embodiment 5

An example of a light emitting device having a top emitting structure is described in this embodiment. The schematic view thereof is shown in FIG. 9.

Figure 9A:
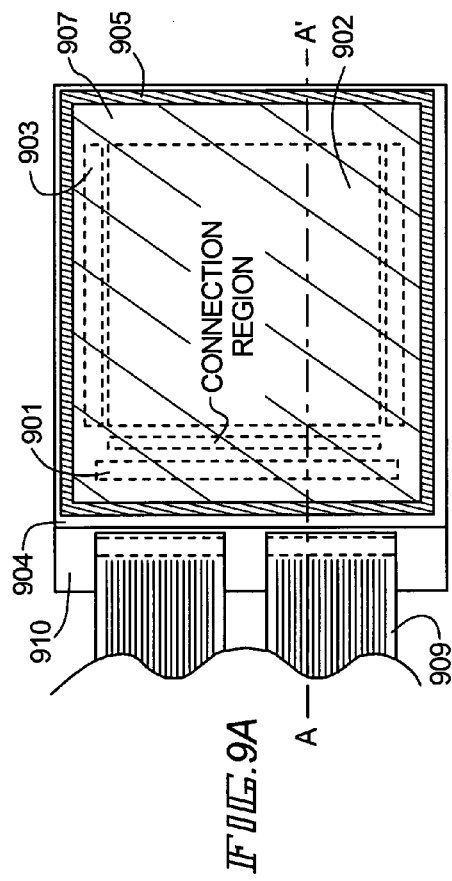
FIGS. 9A and 9B are views showing a top surface view and a cross sectional view of a light emitting device.
Figure 9B:
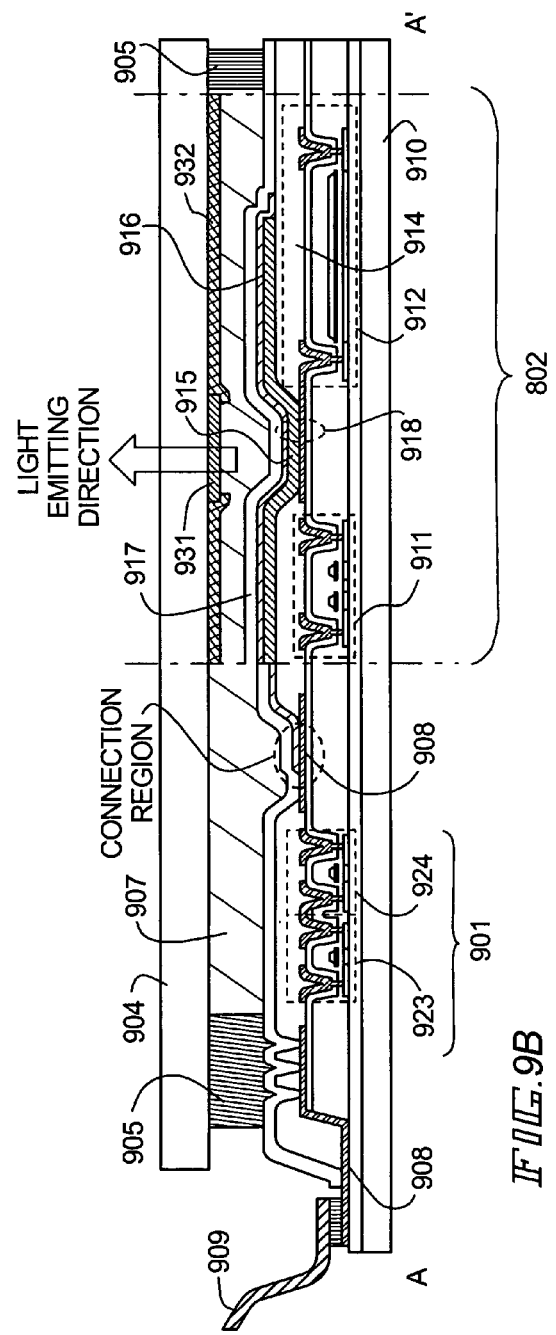

FIG. 9A is a top surface view of the light emitting device. FIG. 9B is a cross-sectional view of FIG. 9A taken along the line A–A'. Reference numeral 901 shown by a dotted line is a source signal drive circuit, 902 is a pixel portion, and 903 is a gate signal drive circuit. Reference numeral 904 is a transparent sealing substrate and 905 is a first sealant. An inner space enclosed by the first sealant 905 is filled with a second transparent sealant 907. A gap agent is contained in the first sealant 905 to keep the distance between substrates.

Further, reference numeral 908 is a wiring for accepting a video signal or a clock signal from FPC (Flexible Print Circuit) 909 that is an external input terminal and transmitting the signals to source signal line drive circuit 901 and a gate signal line drive circuit 903. Though FPC is only illustrated here, a print wiring board (PWB) can be installed in the FPC.

The cross-sectional structure is described with reference to FIG. 9B. A drive citcuit and a pixel portion are formed on the substrate 910. Here, a source signal line drive circuit 901 as a drive circuit and a pixel portion 902 are illustrated.

For the source signal drive cirucit 901, CMOS cirucit composed of an n-channel TFT 923 and a p-channel TFT 924 is formed. TFT that forms a drive circuit may be formed using known CMOS circuit, PMOS circuit, and NMOS circuit. In this embodiment, a driver built-in that formes a drive circuit on a substrate is illustrated, but not exclusive, the drive circuit can be formed outside.

The pixel portion 902 is formed of a plurality of pixels that comprises a switching TFT 911, a current control TFT 912, and a first electrode (anode) 913 connected to a drain of the current control TFT 912. The current control TFT 912 may be either an n-channel TFT or a p-channel TFT, however, when it is connected to an anode, it is preferable to be a p-channel TFT. In addition, it is preferable that a storage capacitor (not shown) be provided appropriately. Here, a cross-sectional structure of only one pixel among numeraous provided pixels is illustrated to show providing two TFTs in one pixel as an example, but three or more TFTs may also be appropriately used.

Since a first electrode 913 contacts directly to a drain of the TFT, the bottom layer of the first electrode 913 is formed of a material that can be an ohmic contact to the drain that is made from silicon. The surface of the first electrode 913 that contacts to a layer containing an organic compound is preferable to be made from a material that has the large work function. When the first electrode is formed of three-laminated structure, for example, a titanium nitride film, an aluminum-based film, and a titanium nitride film, the first electrode can suppress resistance as a wiring low, be a good ohmic contact to the drain, and function as an anode. In addition, the first electrode 913 can be formed either of a single layer such as a titanium nitride film, a chrome film, a tungsten film, a Zn film, or a Pt film, or a laminated structure of three or more layers.

Further, an insulator (referred to as a bank, a barrier, or the like) 914 is formed on both ends of the first electrode (anode) 913. The insulator 914 may be made from an organic resin film or an insulating film containing silicon. Here, a positive photosensitive acrylic resin film is used for forming the insulator 914 as shown in FIG. 9.

For improving the coverage, the upper end portion or the lower end portion of the insulator 914 is formed to have a curved surface having a radius of curvature. For example, when a positive photosensitive acrylic resin film is used for forming the insulator 914, it is preferable that only the upper end portion of the insulator 914 is formed to have a curved surface having a radius of curvature (0.2 µm to 3 µm). As materials for the insulator 914, either a negative photosensitive acrylic resin film that cannot be dissolved in an etchant depending on photosensitive light, or a positive photosensitive acrylic resin film that is dissolved in an etchant depending on photosensitive light can be used.

The insulator 914 may be covered by an aluminum nitride film, an aluminum oxynitride film, a thin film made from carbon as a major components, or a protective film made from silicon nitride film.

On the first electrode (anode) 913, a layer containing an organic compound 915 is selectively formed by vapor deposition using a vapor deposition mask or inkjet. A layer containing an organic compound 915 according to this embodiment is a laminated layer comprising an electroluminescent film 103 shown in FIG. 1, a floating electrode 104, and an electron transport supporting layer 105. Specifically, the layer containing an organic compound 915 may be formed to have the structure shown in Embodiment 2. Note that the floating electrode is preferable to be coated respective pixels for preventing cross talk.

A second electrode (cathode) 916 is formed on the layer containing an organic compound 915. For forming a cathode, materials having small work function (Al, Ag, Li, Ca, or alloy of these elements such as MgAg, MgIn, AlLi, $CaF_2$, or $Ca_3N_2$) can be used. Here, a laminated layer comprising a thin metal film having thin thickness and a transparent conductive film (ITO (indium tin oxide), $In_2O_3$—ZnO (indium oxide zinc oxide alloy), and zinc oxide (ZnO)) is used for the second electrode (cathode) 916 for luminance passing therethrough. Thus, an EL element 918 according to the present invention comprising the layer containing an organic compound 915, and the second electrode (cathode) 916 is completed. Here, since white luminance of the EL element 918 is exemplified, a color filter comprising a coloring layer 931 and a light shielding layer (BM) 932 (an over coat layer is not shown for simplification) is formed.

In addition, if layers containing an organic compound generating luminance of R, G, and B are formed respectively, full color display can be realized without color filter.

A transparent protective layer 917 is formed to seal the EL element 918. An insulating film contained silicon nitride or silicon oxynitride as a major component, a thin film contained carbon as a major component (diamond like carbon film (DLC film), carbon nitride film (CN film), or the like), or a laminated layer comprising these films are preferable to be deposited by sputtering (DC method or RF method) or PCVD to serve as the transparent protective layer 917. The silicon nitride film that has high blocking efficiency against impurities such as moisture or alkaline metals can be formed if being formed under an atmosphere containing nitride and argon using silicon target. Further, the transparent protective film can be formed by a film formation equipment using remote plasma. In addition, it is preferable that the thickness of the transparent protective film is formed to be thin as possible for luminescence emitting therethrough.

A sealing substrate 904 is bonded using a first sealant 905 and a second sealant 904 to seal the EL element 918. For preferable materials for the first sealant 905 and the second sealant 907, epoxy resin is preferable. In addition, it is preferable that the first sealant 905 and the second sealant 907 do not penetrate moisture or oxygen as possible.

For forming the sealing substrate 904, materials such as FRP (fiberglass-reinforced plastics), PVF (polyvinyl fluoride), Mylar, polyester, acrylic, or the like is preferable to be used besides glass substrate or quartz substrate in this embodiment. In addition, a third sealant may be used around the edges to cover the side face (exposed face) of the sealing substrate after the sealing substrate 904 is bonded using the first sealant 905 and the second sealant 907.

Thus, the EL element can be shut off from the outside using the first sealant 905 and the second sealant 907 completely and prevented penetrating moisture or oxygen that cause deterioration of the organic compound layer. Accordingly, high reliable light emitting device can be obtained.

If a transparent conductive film is used as the first electrode 913, both top and bottom emitting type light emitting device can be fabricated.

Embodiment 6

The light emitting device described in Embodiment 4 and Embodiment 5 has good yields, long lifetime, and low drive voltage. Therefore, an electric appliance using the light emitting device according to the present invention has advantages of having good yields and being durable. Particularly, with respect to a portable appliance which use battery as a power source, low power consumption results directly in convenience (extending the battery life). Thus, the light emitting device according to the present invention that has low drive voltage is extremely useful.

Following can be given as such electronic appliances: video cameras; digital cameras; head mounted displays (goggle type displays); car navigation systems; projectors;

car stereos; personal computers; portable information terminals (laptop computers, cell phones or electronic books etc.) etc. Examples of these are shown in FIGS. 10A–10E and FIGS. 11A–11C.

Figure 10A:
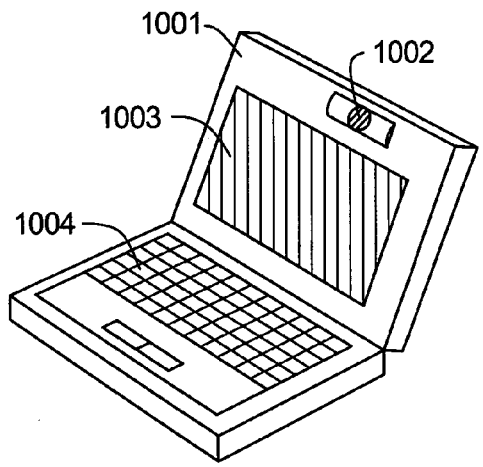
FIGS. 10A–10E are views showing a specific example of electronic appliances.

FIG. 10A is a personal computer which comprises: a main body 1001; an image input section 1002; a display section 1003; and a keyboard 1004 etc.

Figure 10B:
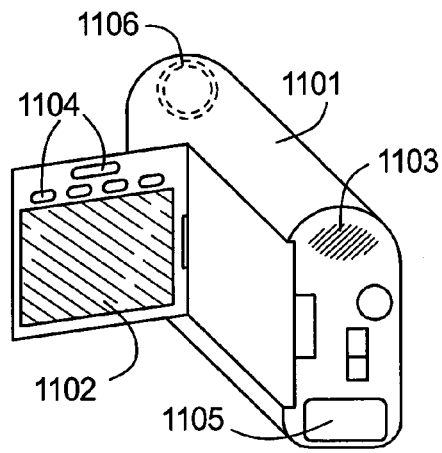

FIG. 10B is a video camera which comprises: a main body 1101; a display section 1102; a voice input section 1103; operation switches 1104; a battery 1105 and an image receiving section 1106 etc.

Figure 10C:
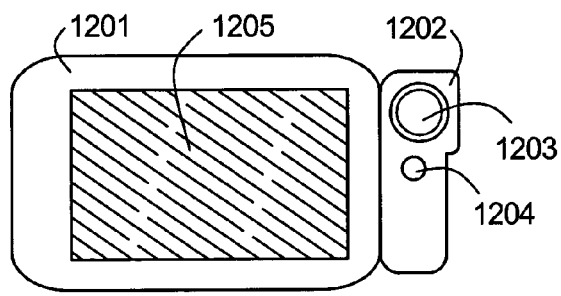

FIG. 10C is a mobile computer which comprises: a main body 1201; a camera section 1202; an image receiving section 1203; operation switches 1204 and a display section 1205 etc.

Figure 10D:
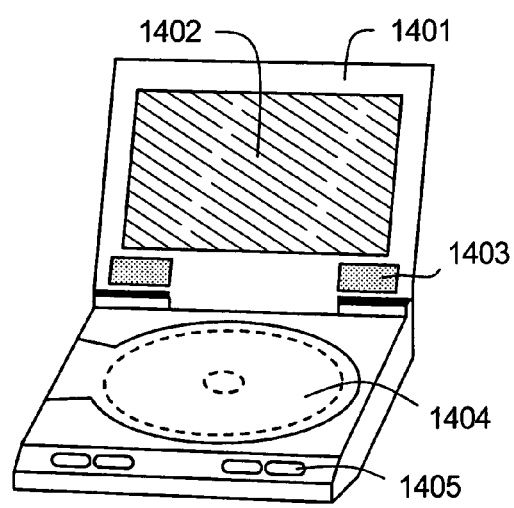

FIG. 10D is a player using a recording medium in which a program is recorded (hereinafter referred to as a recording medium) which comprises: a main body 1401; a display section 1402; a speaker section 1403; a recording medium 1404; and operation switches 1405 etc. This appliance uses DVD (Digital Versatile Disc), CD, etc. for the recording medium, and can perform music appreciation, film appreciation, games and use for Internet.

Figure 10E:
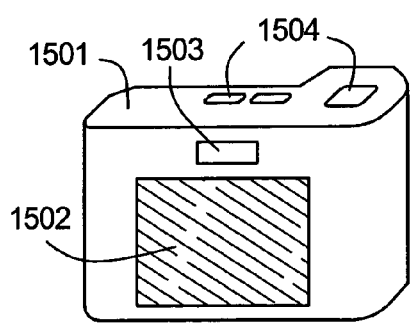

FIG. 10E is a digital camera which comprises: a main body 1501; a display section 1502; a view finder 1503; operation switches 1504; and an image receiving section (not shown in the figure) etc.

Figure 11A:
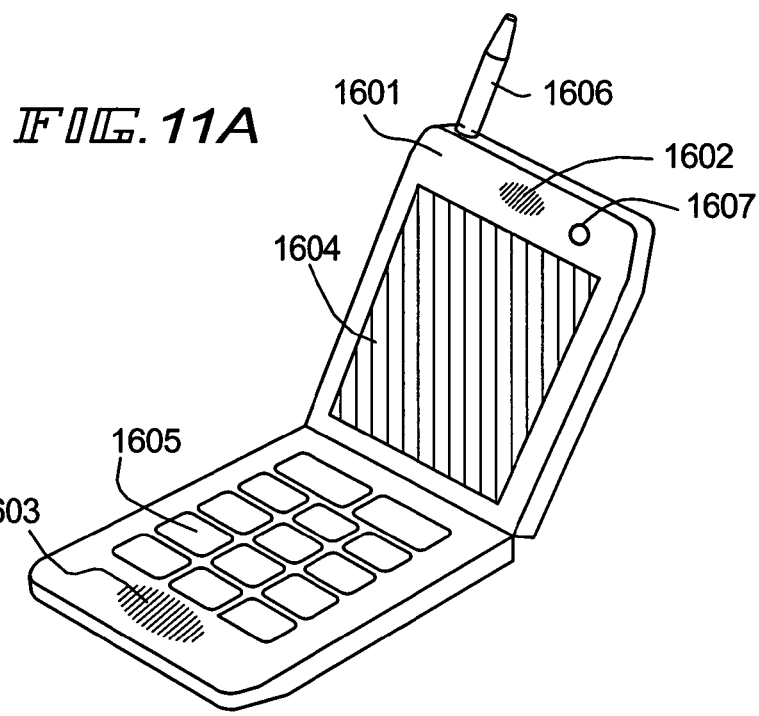
FIGS. 11A–11C are views showing a specific example of electronic appliances.

FIG. 11A is a cell phone which comprises: a main body 1601; a voice output section 1602; a voice input section 1603; a display section 1604; operation switches 1605; an antenna 1606; and an image input section (CCD, image sensor, etc.) 1607 etc.

Figure 11B:
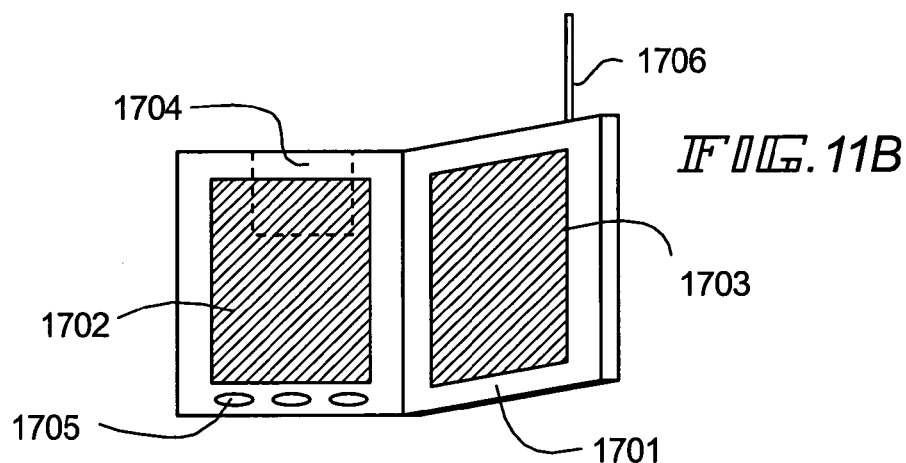

FIG. 11B is a portable book (electronic book) which comprises: a main body 1701; display sections 1702 and 1703; a recording medium 1704; operation switches 1705 and an antenna 1706 etc.

Figure 11C:
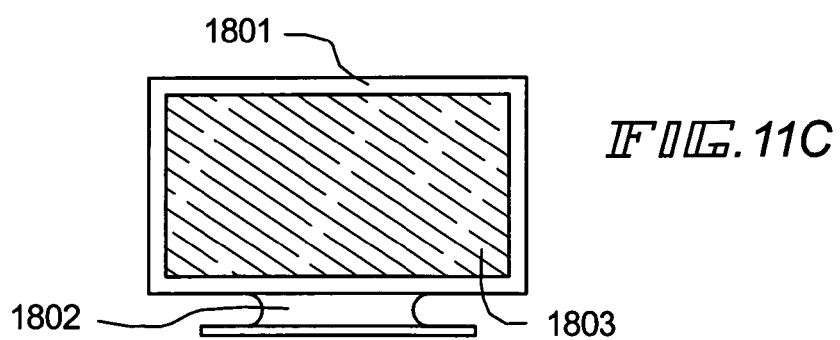
Figure 12:
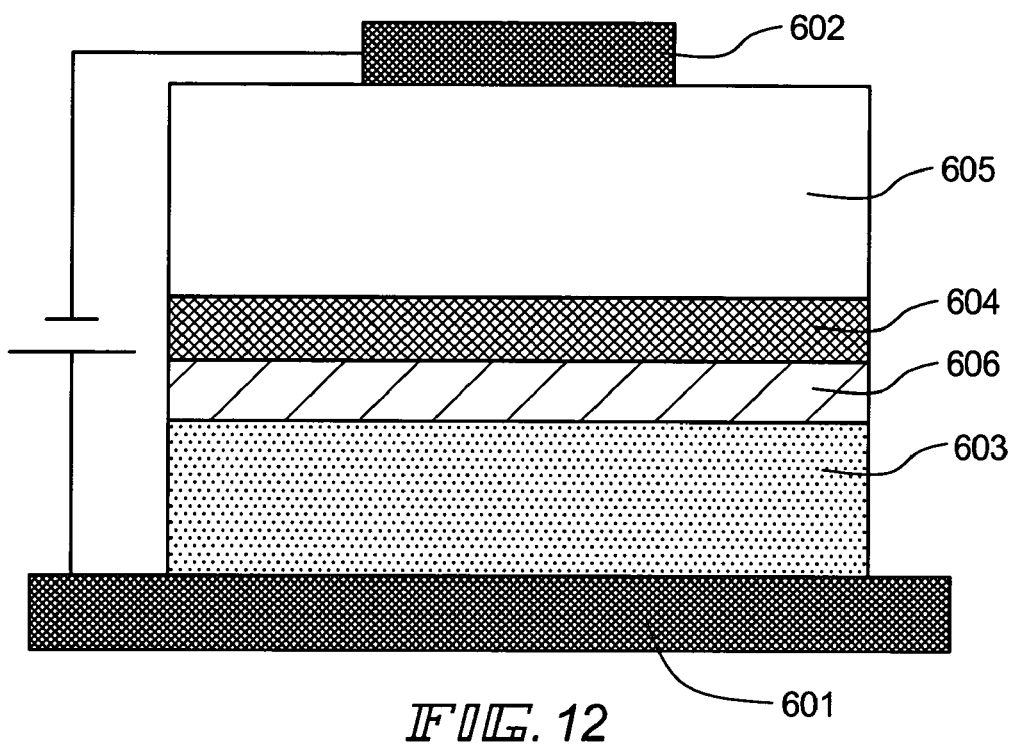
FIG. 12 is a view showing a basic structure of the present invention.

FIG. 11C is a display which comprises: a main body 1801; a supporting section 1802; and a display section 1803 etc.

In addition, the display shown in FIG. 11C has small and medium-sized or large-sized screen, for example a size of 5 to 20 inches. Further, to manufacture the display part with such sizes, it is preferable to mass-produce by gang printing by using a substrate with one meter on a side.

As described above, the applicable range of the present invention is extremely large, and the invention can be applied to electric appliances of various areas.

An EL element that is thicker and driven at lower voltage without doping acceptor or donor than the conventional one can be provided by implementing the present invention. Thus, an EL element that has good yields, long lifetime, and can be driven at low voltage can be provided. Further a light emitting device that has good yields and is durable can be provided by using the EL element.

What is claimed is:

1. An electroluminescence element comprising:
   an anode;
   an electroluminescent film containing an organic compound capable of generating electroluminescence, over the anode;
   an electron transport layer over the electroluminescent film;
   a floating electrode over the electron transport layer;
   an electron transport supporting layer having a thickness of more than 10 nm and less than 1 μm, over the floating electrode; and
   a cathode over the electron transport supporting layer,
   wherein the floating electrode comprises an insulating film formed in contact with the electron transporting layer and a conductive film formed in contact with the electron transport supporting layer.

2. An electroluminescence element according to claim 1, wherein the cathode comprises a conductive film formed by sputtering.

3. An electroluminescence element according to claim 1, wherein the cathode comprises a translucent conductive film formed by sputtering.

4. An electroluminescence element according to claim 1, wherein the cathode comprises a conductive material having a work function of 3.5 eV or more.

5. An electroluminescence element according to claim 1, wherein the electron transport supporting layer comprises an electron-transportable material having an electron mobility which is lager than a hole mobility.

6. An electroluminescence element according to claim 1, wherein the floating electrode comprises a conductive material having a work function of 3.5 eV or less.

7. An electroluminescence element according to claim 1, wherein the electroluminescence element is incorporated into a light emitting device.

8. An electroluminescence element according to claim 1, wherein the electroluminescence element is incorporated into an electric appliance selected from the group consisting of a personal computer, a video camera, a mobile computer, a player, a digital camera, a cell phone, a portable book, and a display.

9. An electroluminescence element comprising:
   a cathode;
   an electron transport supporting layer over the cathode;
   a floating electrode over the electron transport supporting layer;
   an electron transport layer over the floating electrode;
   an electroluminescent film containing an organic compound capable of generating electroluminescence, over the electron transport layer; and
   an anode over the electroluminescent layer,
   wherein at least one of the electroluminescent film and the electron transport supporting layer contains a hole blocking material, and
   wherein the floating electrode comprises an insulating film formed in contact with the electron transporting layer and a conductive film formed in contact with the electron transport supporting layer.

10. An electroluminescence element according to claim 9, wherein the cathode comprises a conductive film formed by sputtering.

11. An electroluminescence element according to claim 9, wherein the cathode comprises a translucent conductive film formed by sputtering.

12. An electroluminescence element according to claim 9, wherein the hole blocking material has an ionization potential of 5.8 eV or more.

13. An electroluminescence element according to claim 9, wherein the hole blocking material is an organic compound containing a phenanthroline skeleton or a penta-coordinate type metal complex having an element belonging to Group 13 of the periodic table as a central metal.

14. An electroluminescence element according to claim 9, wherein the cathode comprises a conductive material having a work function of 3.5 eV or more.

15. An electroluminescence element according to claim 9, wherein the electron transport supporting layer comprises an electron-transportable material having an electron mobility which is lager than a hole mobility.

16. An electroluminescence element according to claim 9, wherein the floating electrode comprises a conductive material having a work function of 3.5 eV or less.

17. An electroluminescence element according to claim 9, wherein the electron transport supporting layer has a film thickness in the range of 10 nm to 1 µm.

18. An electroluminescence element according to claim 9, wherein the electroluminescence element is incorporated into a light emitting device.

19. An electroluminescence element according to claim 9, wherein the electroluminescence element is incorporated into an electric appliance selected from the group consisting of a personal computer, a video camera, a mobile computer, a player, a digital camera, a cell phone, a portable book, and a display.

20. An electroluminescence element comprising:
an anode;
an electroluminescent film containing an organic compound capable of generating electroluminescence, over the anode;
an electron transport layer over the electroluminescent film;
a floating electrode over the electron transport layer;
an electron transport supporting layer over the floating electrode; and
a cathode over the electron transport supporting layer,
wherein the floating electrode comprises an insulating film formed in contact with the electron transporting layer and a conductive film formed in contact with the electron transport supporting layer.

21. An electroluminescence element according to claim 20, wherein the cathode comprises a conductive film formed by sputtering.

22. An electroluminescence element according to claim 20, wherein the cathode comprises a translucent conductive film formed by sputtering.

23. An electroluminescence element according to claim 20, wherein at least one of the electroluminescent film and the electron transport supporting layer contains a hole blocking material, and the hole blocking material has an ionization potential of 5.8 eV or more.

24. An electroluminescence element according to claim 20, wherein at least one of the electroluminescent film and the electron transport supporting layer contains a hole blocking material, and the hole blocking material is an organic compound containing a phenanthroline skeleton or a pentacoordinate type metal complex having an element belonging to Group 13 of the periodic table as a central metal.

25. An electroluminescence element according to claim 20, wherein the cathode comprises a conductive material having a work function of 3.5 eV or more.

26. An electroluminescence element according to claim 20, wherein the electron transport supporting layer comprises an electron-transportable material having an electron mobility which is lager than a hole mobility.

27. An electroluminescence element according to claim 20, wherein the floating electrode comprises a conductive material having a work function of 3.5 eV or less.

28. An electroluminescence element according to claim 20, wherein the electron transport supporting layer has a film thickness in the range of 10 nm to 1 µm.

29. An electroluminescence element according to claim 20, wherein the electroluminescence element is incorporated into a light emitting device.

30. An electroluminescence element according to claim 20, wherein the electroluminescence element is incorporated into an electric appliance selected from the group consisting of a personal computer, a video camera, a mobile computer, a player, a digital camera, a cell phone, a portable book, and a display.

31. An electroluminescence element comprising:
an anode;
an electroluminescent film containing an organic compound that generates electroluminescence, over the anode;
an electron transporting layer over the electroluminescent film;
a floating electrode over the electron transporting layer;
an electron transport supporting layer over the floating electrode; and
a cathode over the electron transport supporting layer,
wherein at least one of the electroluminescent film and the electron transport supporting layer contains a hole blocking material, and
wherein the floating electrode comprises an insulating film formed in contact with the electron transporting layer and a conductive film formed in contact with the electron transport supporting layer.

32. An electroluminescence element according to claim 31, wherein the cathode comprises a conductive film formed by sputtering.

33. An electroluminescence element according to claim 31, wherein the cathode comprises a translucent conductive film formed by sputtering.

34. An electroluminescence element according to claim 31, wherein the hole blocking material has an ionization potential of 5.8 eV or more.

35. An electroluminescence element according to claim 31, wherein the hole blocking material is an organic compound containing a phenanthroline skeleton or a pentacoordinate type metal complex having an element belonging to Group 13 of the periodic table as a central metal.

36. An electroluminescence element according to claim 31, wherein the cathode comprises a conductive material having a work function of 3.5 eV or more.

37. An electroluminescence element according to claim 31, wherein the electron transport supporting layer comprises an electron-transportable material having an electron mobility which is lager than a hole mobility.

38. An electroluminescence element according to claim 31, wherein the floating electrode comprises a conductive material having a work function of 3.5 eV or less.

39. An electroluminescence element according to claim 31, wherein the electron transport supporting layer has a film thickness in the range of 10 nm to 1 µm.

40. An electroluminescence element according to claim 31, wherein the electroluminescence element is incorporated into a light emitting device.

41. An electroluminescence element according to claim 31, wherein the electroluminescence element is incorporated into an electric appliance selected from the group consisting of a personal computer, a video camera, a mobile computer, a player, a digital camera, a cell phone, a portable book, and a display.

42. An electroluminescence element comprising:
a cathode;
an electron transport supporting layer having a thickness of more than 10 nm and less than 1 µm, over the cathode;
a floating electrode over the electron transport supporting layer;
an electron transporting layer over the floating electrode;

an electroluminescent film containing an organic compound that generates electroluminescence, over the electron transporting layer; and an anode over the electroluminescent film, wherein the floating electrode comprises an insulating film formed in contact with the electron transporting layer and a conductive film formed in contact with the electron transport supporting layer.

43. An electroluminescence element according to claim 42, wherein the cathode comprises a conductive film formed by sputtering.

44. An electroluminescence element according to claim 42, wherein the cathode comprises a translucent conductive film formed by sputtering.

45. An electroluminescence element according to claim 42, wherein the cathode comprises a conductive material having a work function of 3.5 eV or more.

46. An electroluminescence element according to claim 42, wherein the electron transport supporting layer comprises an electron-transportable material having an electron mobility which is lager than a hole mobility.

47. An electroluminescence element according to claim 42, wherein the floating electrode comprises a conductive material having a work function of 3.5 eV or less.

48. An electroluminescence element according to claim 42, wherein the electroluminescence element is incorporated into a light emitting device.

49. An electroluminescence element according to claim 42, wherein the electroluminescence element is incorporated into an electric appliance selected from the group consisting of a personal computer, a video camera, a mobile computer, a player, a digital camera, a cell phone, a portable book, and a display.

50. An electroluminescence element comprising:
a cathode;
an electron transport supporting layer over the cathode;
a floating electrode over the electron transport supporting layer;
an electron transporting layer over the floating electrode;
an electroluminescent film containing an organic compound that generates electroluminescence, over the electron transporting layer; and
an anode over the electroluminescent film,
wherein the floating electrode comprises an insulating film formed in contact with the electron transporting layer and a conductive film formed in contact with the electron transport supporting layer.

51. An electroluminescence element according to claim 50, wherein the cathode comprises a conductive film formed by sputtering.

52. An electroluminescence element according to claim 50, wherein the cathode comprises a translucent conductive film formed by sputtering.

53. An electroluminescence element according to claim 50, wherein at least one of the electroluminescent film and the electron transport supporting layer contains a hole blocking material and the hole blocking material has an ionization potential of 5.8 eV or more.

54. An electroluminescence element according to claim 50, wherein at least one of the electroluminescent film and the electron transport supporting layer contains a hole blocking material and the hole blocking material is an organic compound containing a phenanthroline skeleton or a penta-coordinate type metal complex having an element belonging to Group 13 of the periodic table as a central metal.

55. An electroluminescence element according to claim 50, wherein the cathode comprises a conductive material having a work function of 3.5 eV or more.

56. An electroluminescence element according to claim 50, wherein the electron transport supporting layer comprises an electron-transportable material having an electron mobility which is lager than a hole mobility.

57. An electroluminescence element according to claim 50, wherein the floating electrode comprises a conductive material having a work function of 3.5 eV or less.

58. An electroluminescence element according to claim 50, wherein the electron transport supporting layer has a film thickness in the range of 10 nm to 1 μm.

59. An electroluminescence element according to claim 50, wherein the electroluminescence element is incorporated into a light emitting device.

60. An electroluminescence element according to claim 50, wherein the electroluminescence element is incorporated into an electric appliance selected from the group consisting of a personal computer, a video camera, a mobile computer, a player, a digital camera, a cell phone, a portable book, and a display.

* * * * *